(12) United States Patent
Shen et al.

(10) Patent No.: US 12,713,876 B2
(45) Date of Patent: Aug. 18, 2026

(54) SYSTEM AND METHOD FOR CLEANING A WAFER SURFACE

(71) Applicant: Taiwan Semiconductor Manufacturing Company, Ltd., Hsinchu (TW)

(72) Inventors: Chi-hsiang Shen, Tainan (TW); Te-Chien Hou, Kaohsiung (TW); Jeng-Chi Lin, Hsinchu (TW); Tang-Kuei Chang, Tainan (TW); Chen-Hsueh Lin, Kaohsiung (TW); Da-Shiuan Chiou, Taipei (TW); Yu-Jen Shen, Hsinchu (TW); Hui-Chi Huang, Hsinchu (TW); Kei-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 35 days.

(21) Appl. No.: 18/675,661

(22) Filed: May 28, 2024

(65) Prior Publication Data

US 2025/0372435 A1 Dec. 4, 2025

(51) Int. Cl.
*H10P 72/76* (2026.01)
*H10P 70/00* (2026.01)

(52) U.S. Cl.
CPC .......... *H10P 72/7608* (2026.01); *H10P 70/00* (2026.01); *H10P 72/7606* (2026.01)

(58) Field of Classification Search
CPC ......... H01L 21/68728; H01L 21/02041; H01L 21/68721
See application file for complete search history.

(56) References Cited

U.S. PATENT DOCUMENTS 6,863,735 B1 * 3/2005 Nakahara ............ C23C 16/4588 156/345.55
2014/0331927 A1 * 11/2014 Nakano ............ H01L 21/02052 118/620
2022/0157641 A1 * 5/2022 Takahara .......... H01L 21/67748

* cited by examiner

*Primary Examiner* — Erin F Bergner
(74) *Attorney, Agent, or Firm* — Ingrassia Fisher & Lorenz, LLP | IF&L

(57) ABSTRACT

A substrate cleaning system is provided. The substrate cleaning system includes: a substrate chuck configured to hold a substrate during substrate cleaning operations; a substrate cleaning tool; and an end chuck including: a cover section; an open state wherein the cover section is separated into a plurality of non-contiguous sections; and a closed state wherein the cover section forms a substantially contiguous shape above the substrate while the substrate is held by the substrate chuck; wherein in the closed state, the cover section covers end regions near a periphery of the substrate.

20 Claims, 17 Drawing Sheets

1406
Outer height 1409
1412a
1412b
1408a
1410a
1412
1404
Inner height 1411
1408
1410
Z
X 1415
1402
1413
1404
$X_2$
X2'
Inner diameter 1405
Outer diameter 1407
Thickness 1403
1440
1446a
1446
1446b
1442a
1444a
1442
1444

1430
1436a
1436
1436b
1432a
1434a
1432
1434

1420
1426a
1426
1426b
1422a
1424a
1422
1424

SYSTEM AND METHOD FOR CLEANING A WAFER SURFACE

BACKGROUND

Chemical mechanical planarization (CMP) is widely used in the fabrication of integrated circuits. As an integrated circuit is built layer by layer on a surface of a semiconductor wafer, CMP processes are used to planarize the topmost layer or layers to provide a leveled surface for subsequent fabrication operations. CMP processes are carried out by placing the semiconductor wafer in a wafer carrier that presses the wafer surface to be polished against a polishing pad attached to a platen. Both the platen and the wafer carrier are rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows the CMP process to level the wafer surface by both physical and chemical forces. CMP is an effective way to achieve global wafer planarization for advanced integrated circuits.

CMP can be used at a number of points during the fabrication of an integrated circuit. For example, CMP can be used to planarize the inter-level dielectric layers that separate the various circuit layers in an integrated circuit. CMP can also be commonly used in the formation of the metal lines that interconnect components of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
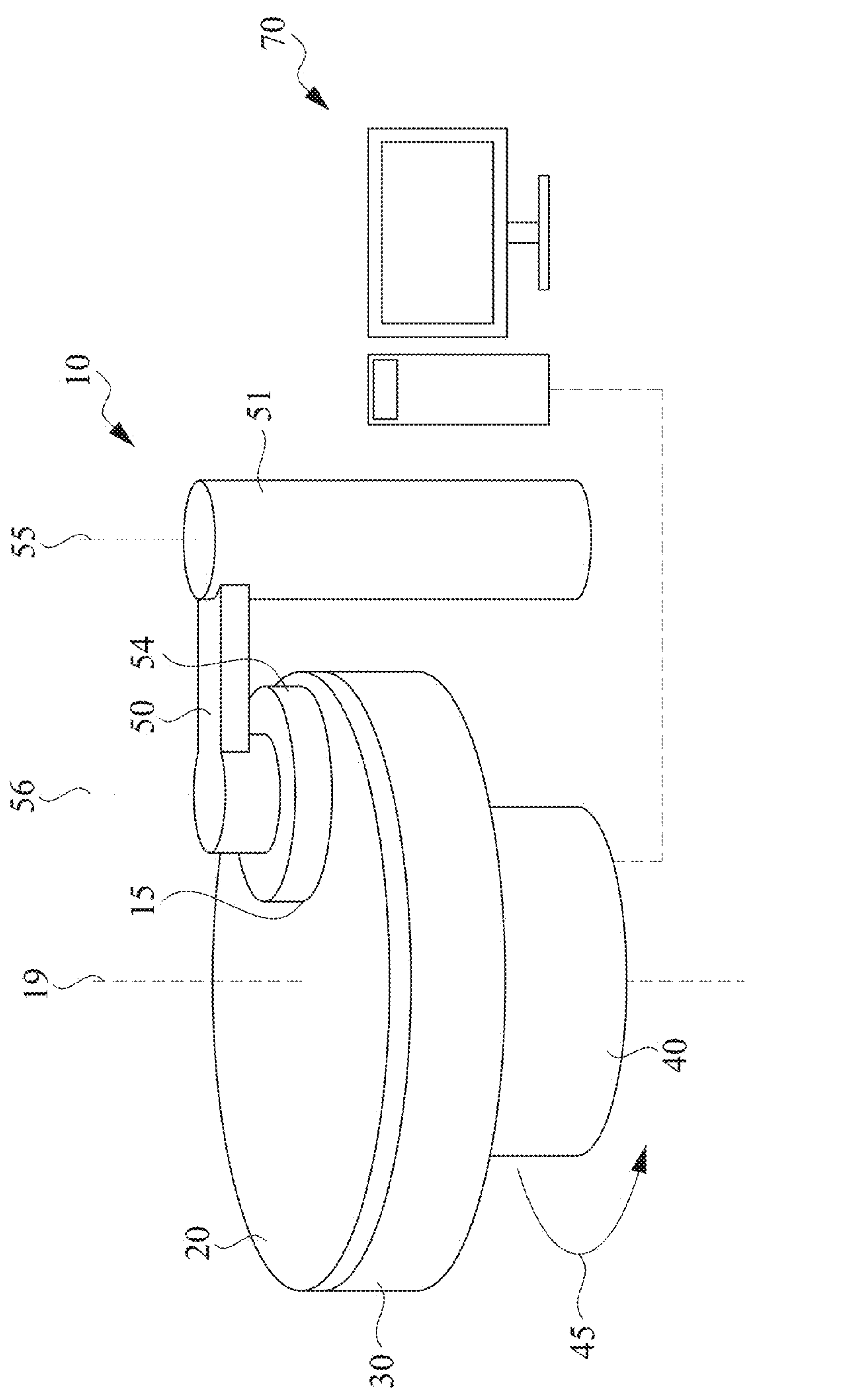
FIG. 1 is an isometric view of an example Chemical Mechanical Planarization (CMP) system, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

As used herein, the terms such as "first," "second" and "third" describe various elements, components, regions, layers and/or sections, but these elements, components, regions, layers and/or sections should not be limited by these terms. These terms may be only used to distinguish one element, component, region, layer, or section from another. The terms such as "first," "second" and "third" when used herein do not imply a sequence or order unless clearly indicated by the context.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

The term "nominal" as used herein refers to a desired or target value, and values above and/or below the desired value, of a characteristic or parameter of a component or process operation set during the design phase of a product or process. The range of values is typically due to minor variations in manufacturing processes or tolerances.

The term "substantially" as used herein means a value of a given quantity that may vary based on the particular technology node associated with the semiconductor element. In some embodiments, the term "substantially" may represent a value of a given amount that varies, for example, within ±5% of a target (or expected) value, based on a particular technology node.

The term "about (about)" as used herein denotes a value of a given amount that may vary based on the particular technology node associated with the subject semiconductor element. In some embodiments, the term "about" may represent a value of a given amount that varies, for example, within 5% to 30% of the value (e.g., ±5% of the value, ±10% of the value, ±20%, or ±30% of the value), based on the particular technology node.

The term "vertical" as used herein refers to a surface that is nominally perpendicular to the substrate.

It is to be understood that the phraseology or terminology herein is for the purpose of description and not of limitation, such that the terminology or phraseology of the present specification is to be interpreted by those skilled in relevant art(s) in light of the teachings herein.

Integrated circuits contain numerous devices such as transistors, diodes, capacitors, and resistors that are fabricated on and/or in a semiconductor substrate. These devices are initially isolated from one another and are later interconnected to form functional circuits. As device densities in integrated circuits increase, multiple wiring levels are required to achieve interconnections of these devices. CMP processes are commonly used in the formation of multilevel interconnect structures.

In a multilevel interconnect structure, conductive lines (e.g., copper lines) are laid in stacked dielectric layers and are connected through vias from one layer to another layer. The conductive lines and vias are fabricated using single or dual damascene processes in some instances. In such processes, a dielectric layer is patterned to form contact openings including trenches and/or via openings. A barrier layer is deposited along sidewalls and bottom surfaces of the contact openings, followed by depositing a conductive layer over the barrier layer to overfill the contact openings. A CMP process is then performed to remove the overlying conductive layer and barrier layer from the surface of the dielectric layer, thus forming isolated conductive contacts.

Chemical Mechanical Planarization (CMP) is a wafer surface planarization technique that planarizes a wafer surface by relative motion between a wafer and a polishing pad in the presence of slurry while applying pressure (downforce) to the wafer. CMP tools are considered "grinders". In a grinder, the wafer is placed face down on a wafer support or carrier. The opposing wafer surface holds the polishing pad against a flat surface, which is referred to as a "platen". The grinding machine may use a rotary or orbital motion during the grinding process. CMP achieves planarity of the wafer by removing raised features of the wafer surface relative to recessed features.

Slurries are mixtures of fine abrasive particles and chemicals used to remove certain materials from the wafer surface during a CMP process. Accurate slurry mixing and consistent batch mixing are important to achieving wafer to wafer (WtW) and lot to lot (lot to lot; LtL) polishing repeatability (e.g., consistent polishing rate, consistent polishing uniformity across wafer and die, etc.). The quality of the slurry is important so that scratches on the wafer surface can be prevented during the CMP process.

An abrasive pad is attached to the top surface of the platen. The polishing pad may be made of, for example, polyurethane (polyurethane), based on the mechanical properties and porosity of polyurethane. Further, the polishing pad may have small perforations (e.g., grooves) to help transport slurry along the surface of the wafer and to promote uniform polishing. The polishing pad also removes the products of the reaction from the surface of the wafer.

After CMP operations, the wafer may be cleaned by one or more wafer cleaning tools (e.g., brushes and/or pencils). The brushes and pencils remove residue leftover on the wafer from the CMP operations.

Apparatus, systems, operations, and techniques disclosed herein describe

FIG. 1 is an isometric view of an example Chemical Mechanical Planarization (CMP) system 10, in accordance with some embodiments. The example CMP system 10 is configured for performing a CMP process on a wafer 15 in a semiconductor manufacturing process.

In certain embodiments, the CMP system 10 includes a polishing pad 20, a platen 30, a platen motor 40, a wafer holder assembly 50 and a controller 70. The elements of the CMP system 10 can be added to or omitted, and the disclosure should not be limited by the embodiments. For example, in certain embodiments the CMP system 10 may include an atomizer, a slurry dispenser, and a conditioning assembly.

The platen 30 is configured to receive and rotate the polishing pad 20 about a center axis 19. In some embodiments, the platen 30 is circular in shape. The diameter of the platen 30 lies in a range that is substantially larger than the diameter of the wafer 15 to be polished.

The platen motor 40 rotates the platen 30 in the direction of arrow 45 about the axis 19. As shown, the platen motor 40 is electrically connected to the controller 70 and may be actuated and operated by the controller 70.

In certain embodiments, the polishing pad 20 is fixed onto the platen 30. The polishing pad 20 may be a consumable item used in a semiconductor wafer fabrication process. In certain embodiments, the polishing pad 20 may be a hard, incompressible pad or a soft pad. For oxide polishing, hard and stiffer pads are generally used to achieve planarity. Softer pads are generally used in other polishing processes to achieve improved uniformity and a smooth surface. The hard pads and the soft pads may also be combined in an arrangement of stacked pads for customized applications.

The wafer holder assembly 50 is used to support the wafer 15. In some embodiments, the wafer holder assembly 50 includes a shaft 51 with a driving motor, and a carrier head 54. The driving motor may be configured to control the movement of the carrier head 54 about a rotation axis 55. In some embodiments, the driving motor is an electric motor which converts electrical energy into mechanical energy for driving the rotation of the shaft 51. In some embodiments, the shaft 51 is driven to be rotatable about the rotation axis 55 by an external force (e.g., frictional force generated between the polishing pad 20 and the wafer 15) that is applied to the shaft 51 no matter which operation state of the driving motor.

In some embodiments, the carrier head 54 is rotatable about a rotation axis 56 by another driving motor (not shown in figures). The rotation axis 56 is different from the rotation axis 55.

The carrier head 54 may include a retainer retaining ring having an annular shape and a hollow center. The wafer 15 may be placed in the hollow center of retaining ring during the CMP process.

In one or more examples, the controller 70 includes or may be implemented in a computer including hardware, software, firmware, or any combination thereof. If implemented in software, the functions may be stored as one or more instructions or code on a computer-readable medium and executed by a hardware-based processing unit. Computer-readable media may include non-transitory computer-readable media, which corresponds to a tangible medium such as data storage media (e.g., RAM, ROM, EEPROM, flash memory, or any other medium that can be used to store desired program code in the form of instructions or data structures and that can be accessed by a computer).

Instructions may be configurable to be executed by one or more processors, such as one or more digital signal processors (DSPs), general purpose microprocessors, application specific integrated circuits (ASICs), field programmable logic arrays (FPGAs), or other equivalent integrated or discrete logic circuitry, included in controller 70. Accordingly, the term "processor" as used herein may refer to any of the foregoing structure or any other physical structure suitable for implementation of the described techniques. Also, the techniques could be fully implemented in one or more circuits or logic elements.

Figures 2A, 2B, 2C:
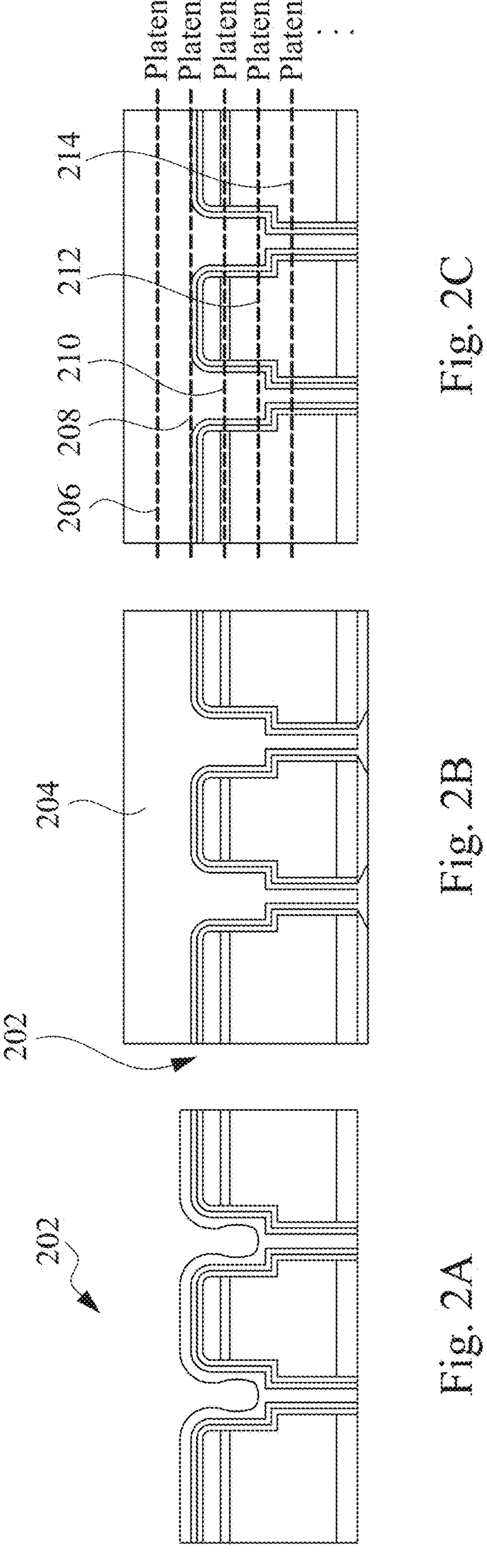
FIG. 2A illustrates an example semiconductor structure at one stage of fabrication, in accordance with various embodiments.
FIG. 2B illustrates a different stage of fabrication wherein a material layer has been deposited over the example semiconductor structure, in accordance with various embodiments.
FIG. 2C illustrates further stages of fabrication wherein one or more polishing pads are used to polish the material layer and/or the semiconductor structure, in accordance with various embodiments.

FIG. 2A illustrates an example semiconductor structure 202 at one stage of fabrication. FIG. 2B illustrates a different stage of fabrication wherein a material layer 204 has been deposited over the example semiconductor structure 202. FIG. 2C illustrates further stages of fabrication wherein one or more polishing pads are used to polish the material layer 204 and/or the semiconductor structure 202. In this example, the material layer 204 is polished to a first level 206 (platen 1), followed by the material layer 204 being polished to a second level 208 (platen 2), followed by the material layer 204 and the semiconductor structure 202 being polished to a third level 210 (platen 3), followed by the material layer 204 and the semiconductor structure 202 being polished to a fourth level 212 (platen 4), and followed by the material layer 204 and the semiconductor structure 202 being polished to a fifth level 214 (platen 5). In other examples, the material layer 204 and/or the semiconductor structure 202 may be polished to fewer or additional levels.

Figure 3:
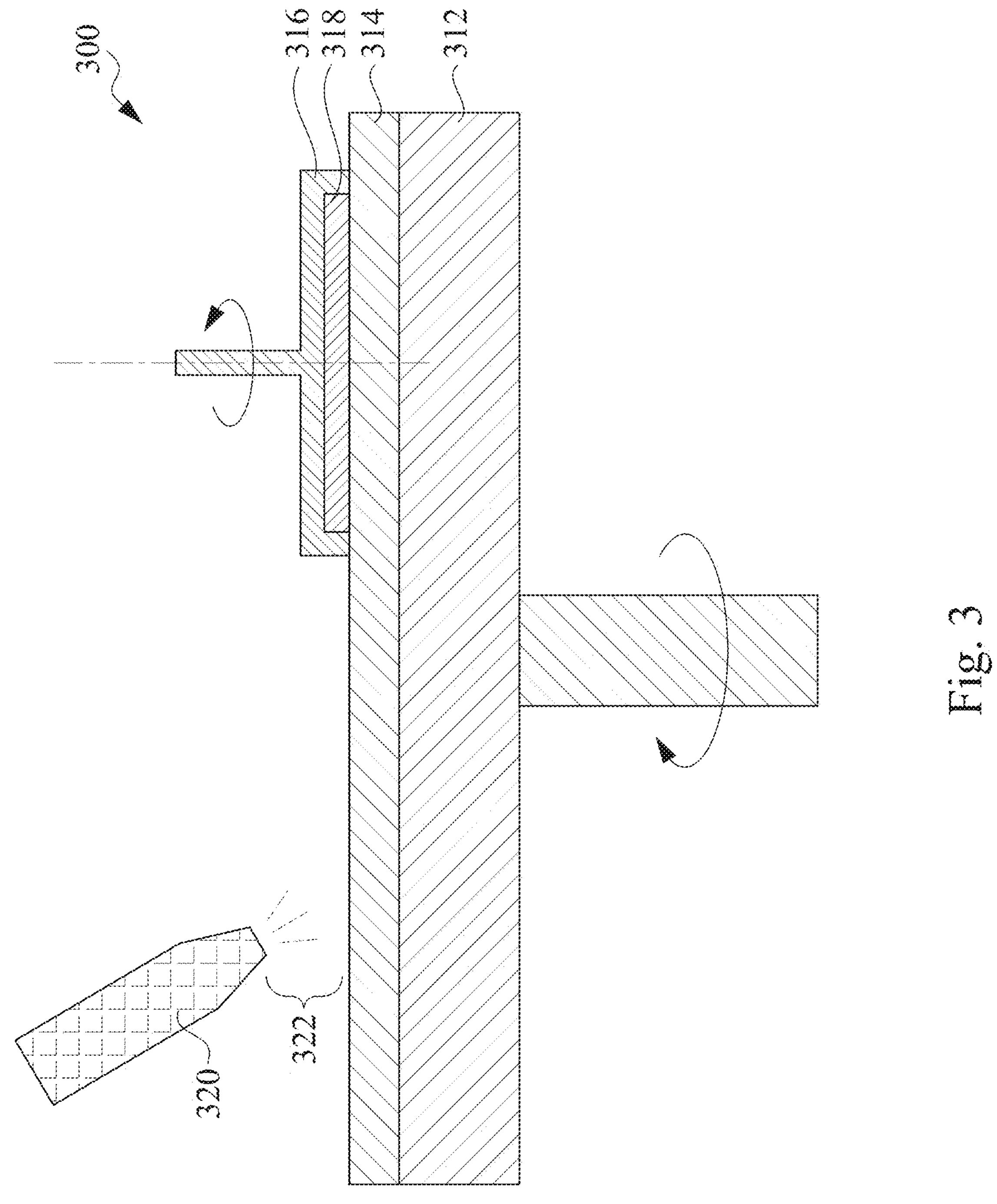
FIG. 3 schematically illustrates CMP of a wafer according to some embodiments using an example CMP system, in accordance with various embodiments.

FIG. 3 schematically illustrates CMP of a wafer according to some embodiments using an example CMP system 300. The example CMP system 300 includes a polishing platen 312, a polishing pad 314 over the polishing platen 312, a polishing head 316 over the polishing pad 314 for holding a wafer against the polishing pad 314, and a slurry dispenser 320 for dispensing an abrasive slurry 322. The abrasive slurry dispenser 320 has an outlet directly above the polishing pad 314 for dispensing the abrasive slurry 322 onto the polishing pad 314.

During CMP, the abrasive slurry 322 is dispensed onto the polishing pad 314 by the abrasive slurry dispenser 320. The abrasive slurry 322 contains reactive chemicals that react with the surface layer of the wafer 318. In addition, the abrasive slurry 322 contains abrasive particles for mechanically polishing the wafer 318.

The polishing pad 314 is formed of a material that is sufficiently hard to allow abrasive particles in an abrasive slurry to mechanically polish the wafer 318 under the polishing head 316. On the other hand, the polishing pad 314 is also soft enough so that it does not substantially scratch the wafer 318. During the CMP process, the polishing platen 312 is rotated by a mechanism (not shown), and thus the polishing pad 314 fixed on the polishing platen is also rotated together with the polishing platen 312. The mechanism (e.g., motor and/or gears) for rotating the polishing pad 314 is not illustrated.

During the CMP process, the polishing head 316 is also rotated, and thus the wafer 318 secured to the polishing head 316 is caused to rotate. According to some embodiments, the polishing head 316 rotates in the same direction (clockwise or counterclockwise) as the polishing pad 314. According to an alternative embodiment, the polishing head 316 and the polishing pad 314 rotate in opposite directions. The mechanism for rotating the polishing head 316 is not described. As the polishing pad 314 and polishing head 316 rotate, the slurry 322 flows between the wafer 318 and the polishing pad 314. The surface layer of the wafer 318 is planarized by chemical reaction between the reactive chemicals in the abrasive slurry 322 and the surface layer of the wafer 318, and further by mechanical polishing.

After the CMP process, the surface of the wafer 318 on which the CMP process is performed is cleaned to remove residues. Efficient and complete removal of the polishing slurry and other polishing residues and particulates following polishing is performed to prevent introduction of defects into the polished product. The post-CMP cleaning may include a number of steps, including (and not limited to): cleaning with acidic chemical solutions, cleaning with basic chemical solutions, cleaning with neutral chemical solutions, and rinsing with deionized water (DI water). The post-CMP cleaning may also include multiple cycles, each cycle including a chemical solution cleaning step and a rinse step. In post-CMP cleaning, a wafer cleaning tool such as a brush and/or a pencil may be used to remove residue on the wafer.

Figure 4:
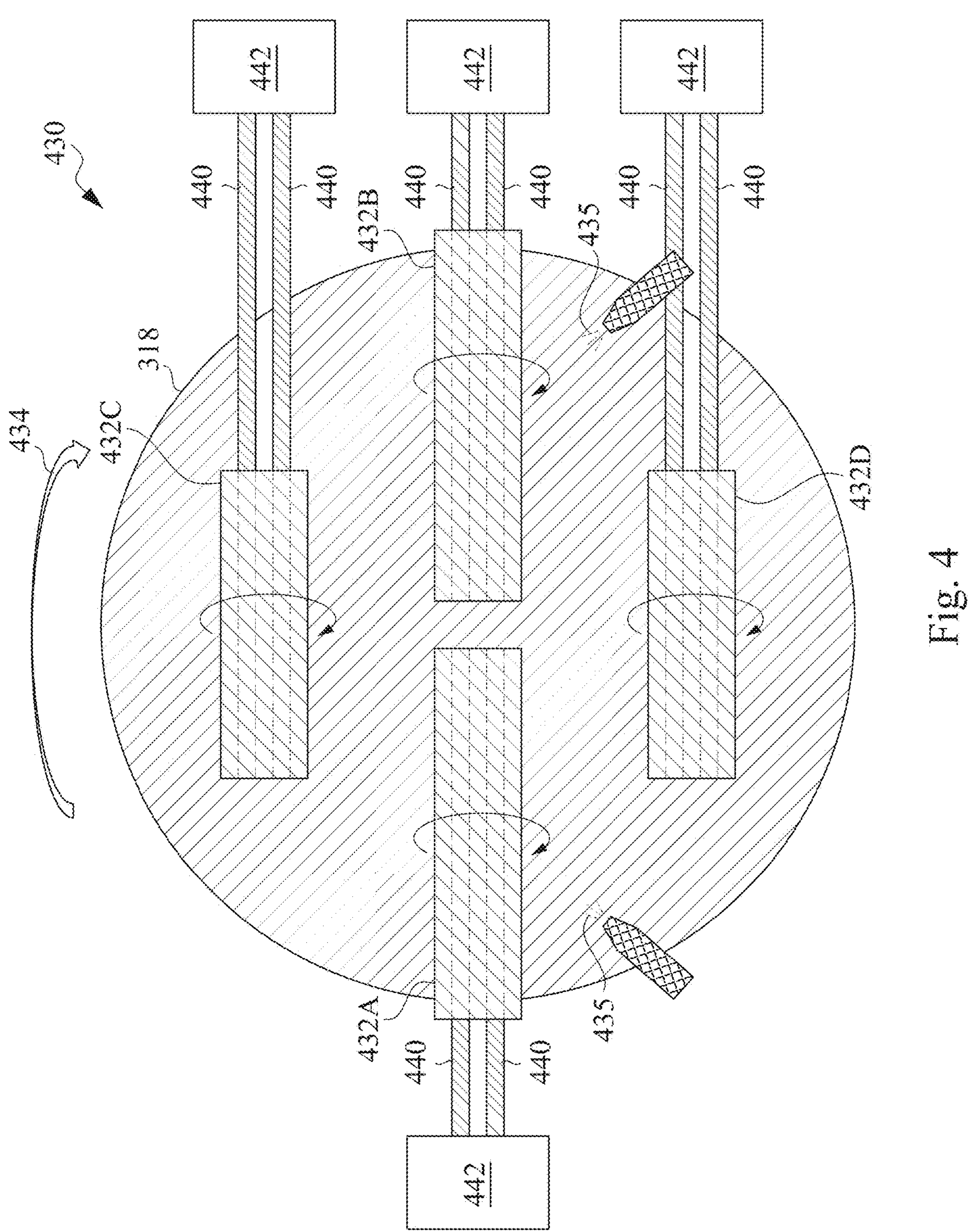
FIG. 4 illustrates a top view of a stage in a post-CMP cleaning and a corresponding cleaning apparatus, in accordance with various embodiments.

FIG. 4 illustrates a top view of a stage in a post-CMP cleaning and a corresponding cleaning apparatus 430, according to some embodiments. The wafer 318 on which the CMP process has been performed still has residues on the surface of the wafer 318, and the residues need to be removed from the wafer 318. The residue may include organic matter and particles. The cleaning process is referred to as a post-CMP cleaning process.

The cleaning apparatus 430 includes a plurality of brushes 432A, 432B, 432C, and 432D (sometimes also referred to as brush rollers due to their circular cross-sectional shape). According to various embodiments, the brushes 432A, 432B, 432C and 432D may be formed of polyvinyl alcohol (PVA), or may be formed of other materials. Further, the brushes 432A, 432B, 432C and 432D may be manufactured to have a sponge form. During the post-CMP cleaning process, the wafer 318 is rotated, for example, as illustrated by arrow 434. At the same time, the brushes 432A, 432B, 432C and 432D also rotate with their own axes. The axes of the brushes 432A, 432B, 432C and 432D are in the longitudinal direction of the respective brushes and parallel to the surface of the wafer 318. The brushes 432A, 432B, 432C, and 432D have a cylindrical shape. Also, the cross-sectional view of each of the brushes 432A, 432B, 432C and 432D is circular, and thus removes residue from the surface of the wafer 318 as the brushes rotate.

Each of the brushes 432A, 432B, 432C, and 432D is fitted to an end portion of a respective connection component 440, which is configured to support the respective brush 432A, 432B, 432C, and 432D. As the connection component 440 rotates, the brushes 432A, 432B, 432C and 432D also rotate. According to some embodiments, the connection components 440 are hollow with spaces therein, and DI water and/or chemical solution can pass through the spaces into the brushes 432A, 432B, 432C and 432D and be dispensed onto the brushes 432A, 432B, 432C and 432D. In addition, each of the brushes 432A, 432B, 432C and 432D is connected to one of the drive components 442 configured to rotate and/or move/oscillate the respective connection component 440 and the respective brush. Thus, by operation of the drive components 442, the brushes 432A, 432B, 432C and 432D can be rotated and/or rocked. The drive components 442 may include, for example, motors, slide guides, robotic arms, gears (not shown), and the like.

During cleaning, a chemical solution (hereinafter referred to as a cleaning solution 435) is sprayed onto the surface of the wafer 318. The cleaning solution 435 may comprise various types, and different types of cleaning solutions 435 may be used to clean different residues on the wafer. According to some embodiments, the cleaning solution 435 comprises an acidic chemical solution, which may comprise an organic acid such as citric acid, such as $HNO_3$ Inorganic acids, and the like. According to some embodiments, the cleaning solution 435 comprises an alkaline chemical solution, which may comprise, for example, $NR_3$ (wherein R is an alkyl group), etc., such as $NH_4OH$, or the like. A surfactant, such as sodium lauryl sulfate, may be added to the cleaning solution 435 to reduce the surface tension of the cleaning solution 435. The cleaning solution 435 may include water as a solvent. The cleaning solution 435 may also use an organic solvent such as methanol. The cleaning solution 435 may also be an aqueous solution comprising hydrogen peroxide. For example, the cleaning solution 435 may include $H_2O_2$An aqueous solution. The cleaning solution 435 is rolled into the brushes 432A, 432B, 432C and 432D by the rotation of the wafer 318, and the brushes clean the surface of the wafer 318 with the cleaning solution 435 while the brushes are rotated.

Figure 5:
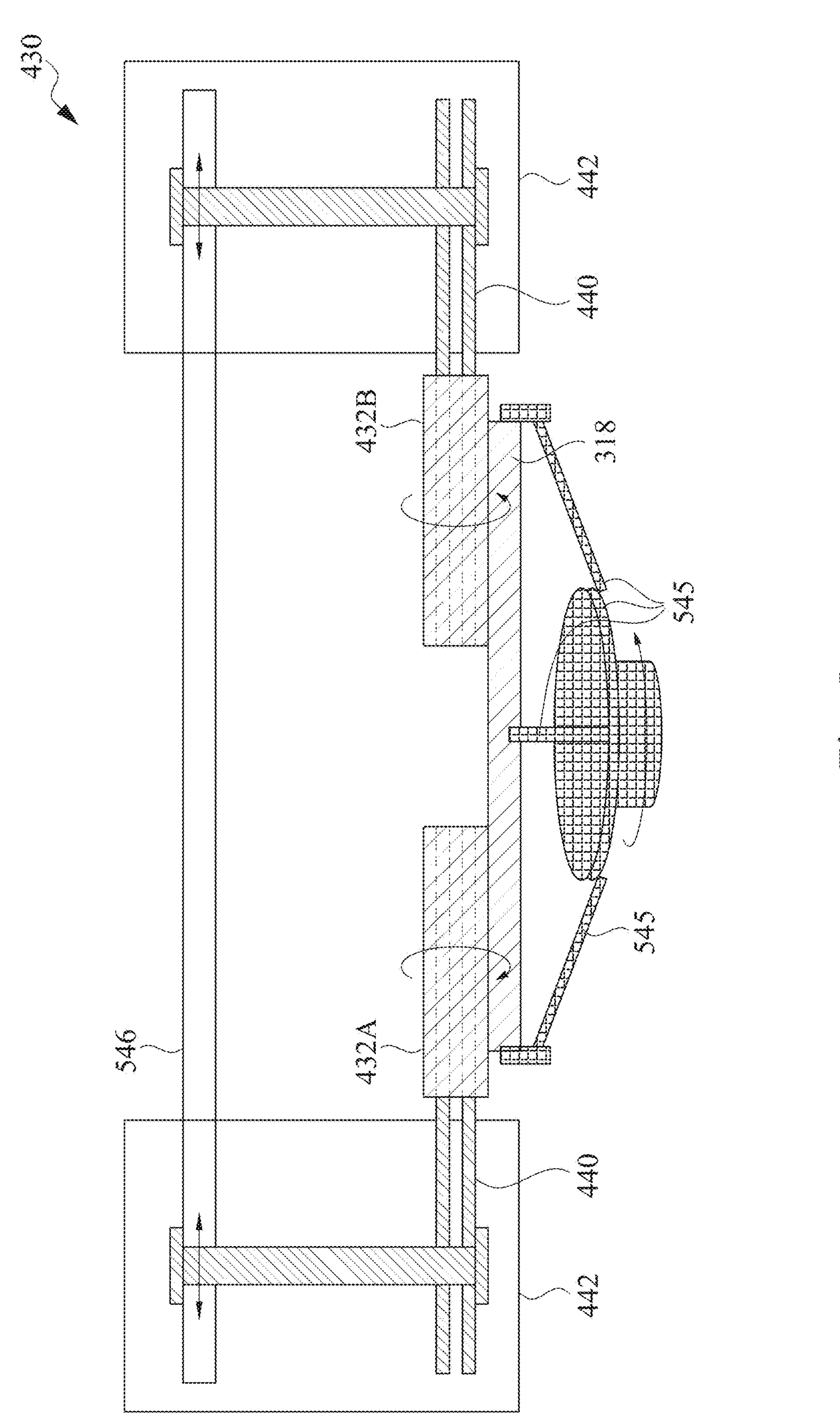
FIG. 5 illustrates a cross-sectional view of the structure in FIG. 4, wherein the cross-sectional view is taken in a plane containing a diameter of the wafer, in accordance with various embodiments.

FIG. 5 illustrates a cross-sectional view of the structure in FIG. 4, wherein the cross-sectional view is taken in a plane containing a diameter of the wafer 318. The wafer 318 is placed on a chuck 545 and secured by the chuck 545, which rotates and thus the overlying wafer 318 also rotates. According to some embodiments, the drive components 442 includes a sliding guide 546 to which the connection component 440 is attached. The brushes 432A and 432B may oscillate back and forth by driving the connection component 440 to slide along the slide guide 546. According to alternative embodiments, other mechanisms, such as robotic arms, may be used to affect the oscillation of the brushes.

Figure 6:
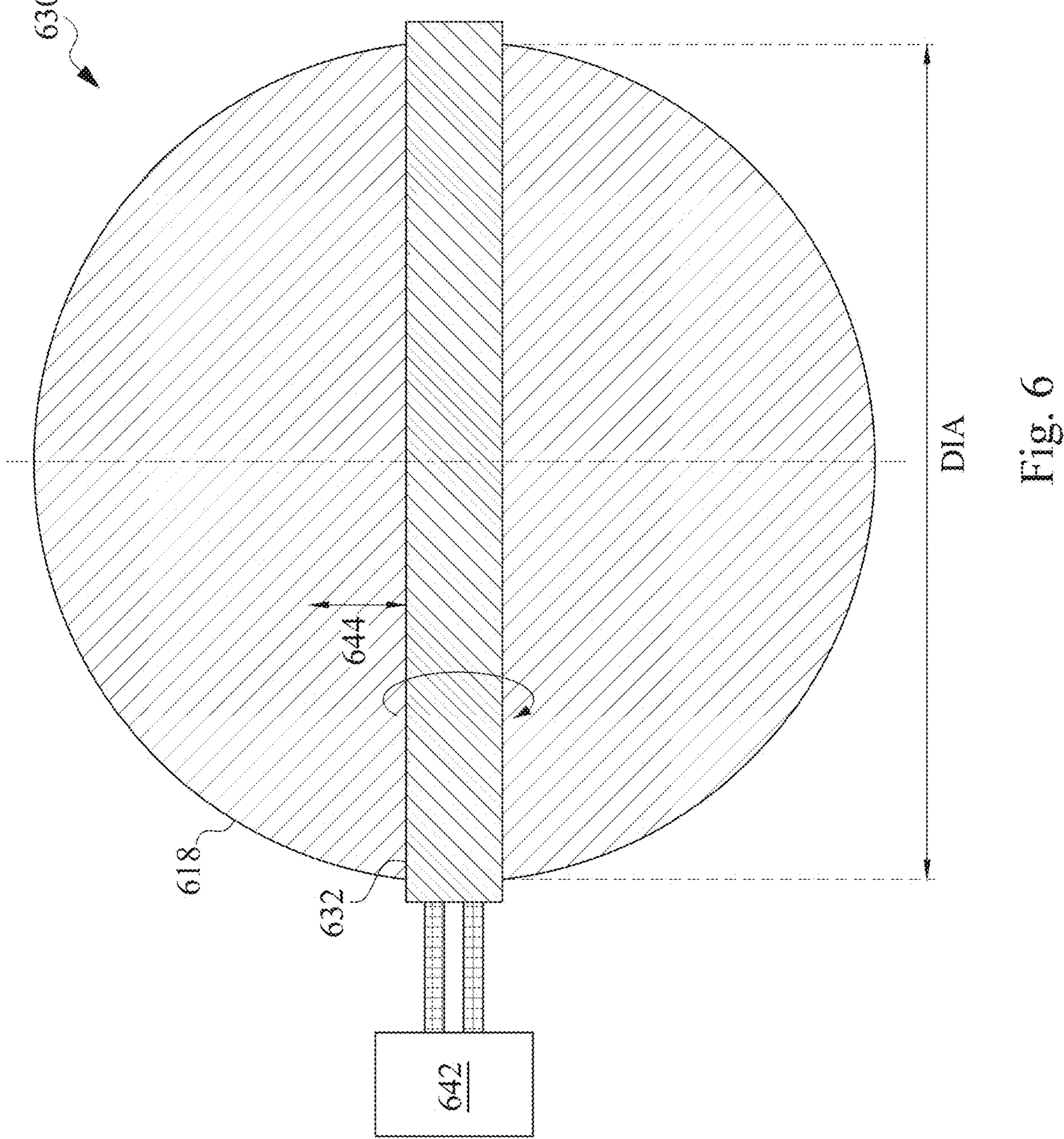
FIG. 6 illustrates a top view of an example stage in a post-CMP cleaning and a corresponding cleaning apparatus, in accordance with various embodiments.

FIG. 6 illustrates a top view of an example stage in a post-CMP cleaning and a corresponding cleaning apparatus 630, according to some embodiments. In these embodiments, a drive component 642 is configured to rotate and/or move/oscillate a brush 632. The brush 632 has a length equal to or greater than the diameter DIA of the wafer 618. Thus, at any given time, the brushed area intersects the entire diameter of the wafer 618. The brush 632 may be configured to oscillate up and down, as shown by the double arrow 644.

Figure 7:
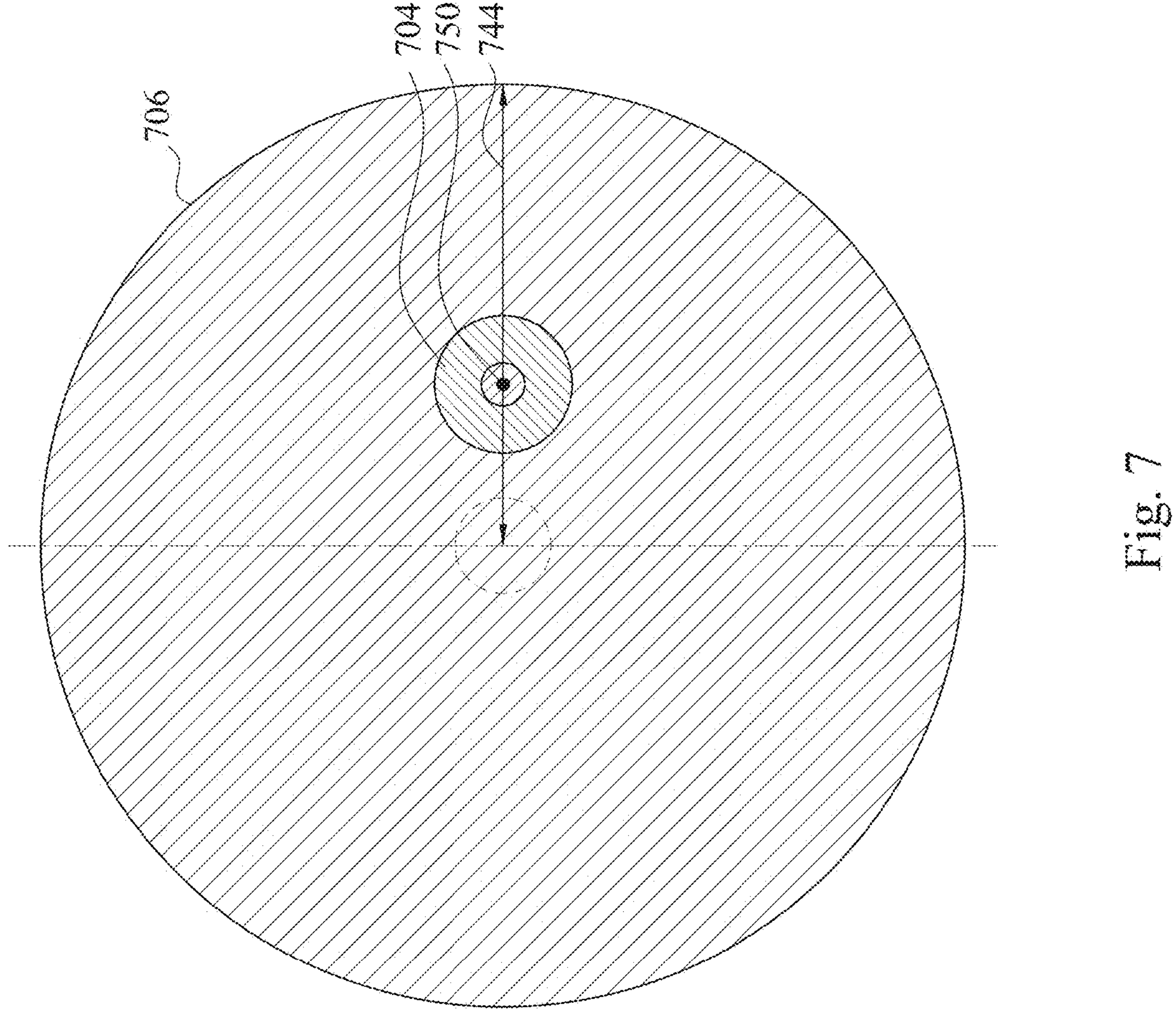
FIG. 7 illustrates a top view of an example stage in a post-CMP cleaning and a pencil-type wiper used to clean a wafer, in accordance with various embodiments.

FIG. 7 illustrates a top view of an example stage in a post-CMP cleaning and a pencil-type wiper used to clean a wafer, according to some embodiments. In these embodiments, a pencil-type brush 704 is used to clean a wafer 706. The pencil brush 704 is rotatable about its axis 750. The pencil type of brush differs from brushes using a brush roller in that the rotational axis of the brush (e.g., 432*a*, 432*b*, 432*c*, 432*d*, 732) is parallel to the surface of the wafer, whereas the rotational axis of the pencil brush 704 is perpendicular to the surface of the wafer 706. Additionally, the pencil brush pencil brush 704 may oscillate between the center and the edge of the wafer 706, with the oscillation range illustrated as double arrow 744.

After post-CMP cleaning, the wafer is dried, for example, using isopropyl alcohol and nitrogen gas.

Figure 8B:
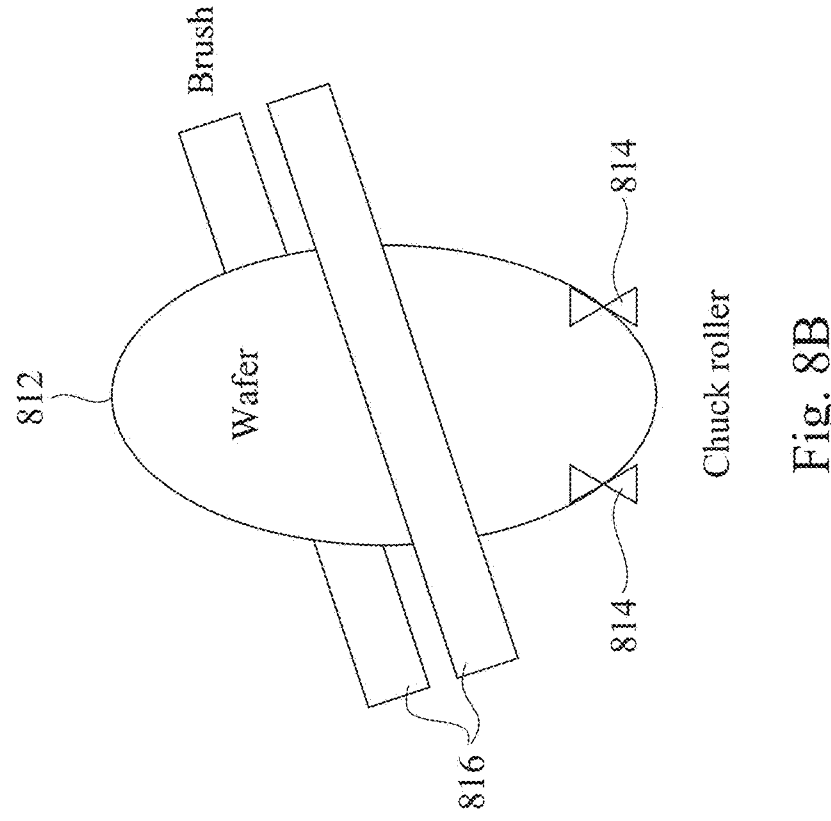
FIG. 8B is a side view of a stage in a post-CMP cleaning that schematically illustrates vertical wafer cleaning, in accordance with various embodiments.
Figure 8A:
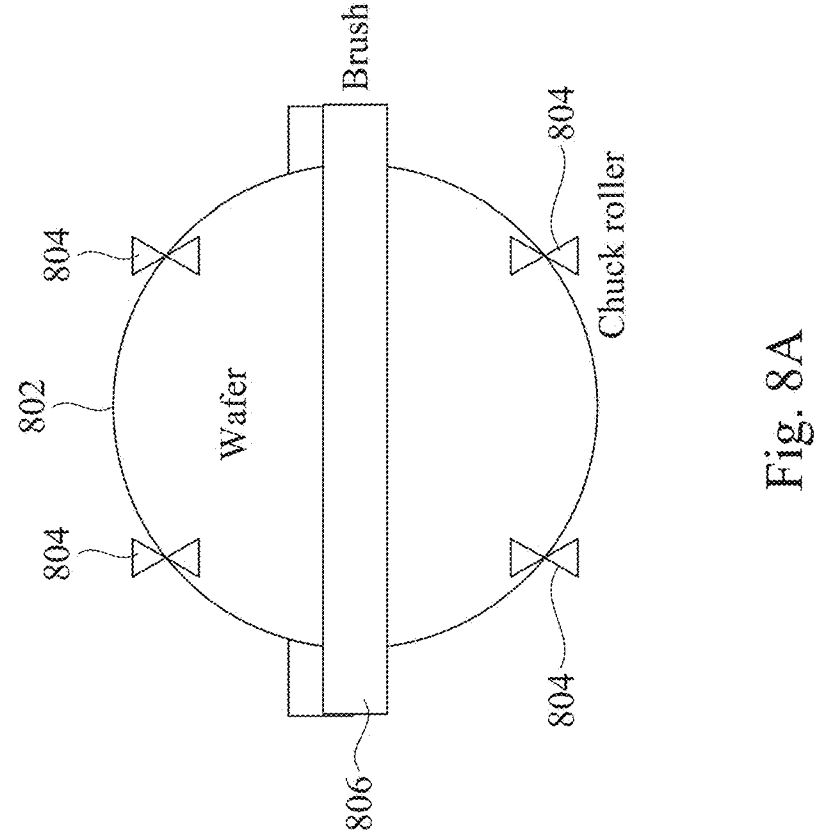
FIG. 8A is a top view of a stage in a post-CMP cleaning that schematically illustrates horizontal wafer cleaning, in accordance with various embodiments.

FIG. 8A is a top view of a stage in a post-CMP cleaning that schematically illustrates horizontal wafer cleaning, according to some embodiments. In these embodiments, a wafer 802 is supported by a wafer chuck roller 804 such that the diameter of the wafer 802 is in a horizontal plane. One or more brushes brush 806 are rotated across one or both surfaces of the wafer 802 to clean the wafer of residue after CMP.

FIG. 8B is a side view of a stage in a post-CMP cleaning that schematically illustrates vertical wafer cleaning, according to some embodiments. In these embodiments, a wafer 812 is supported by a wafer chuck roller 814 such that the diameter of the wafer 812 is in a vertical plane. One or more brushes 816 are rotated across one or both surfaces of the wafer 812 to clean the wafer of residue after CMP.

Figure 9:
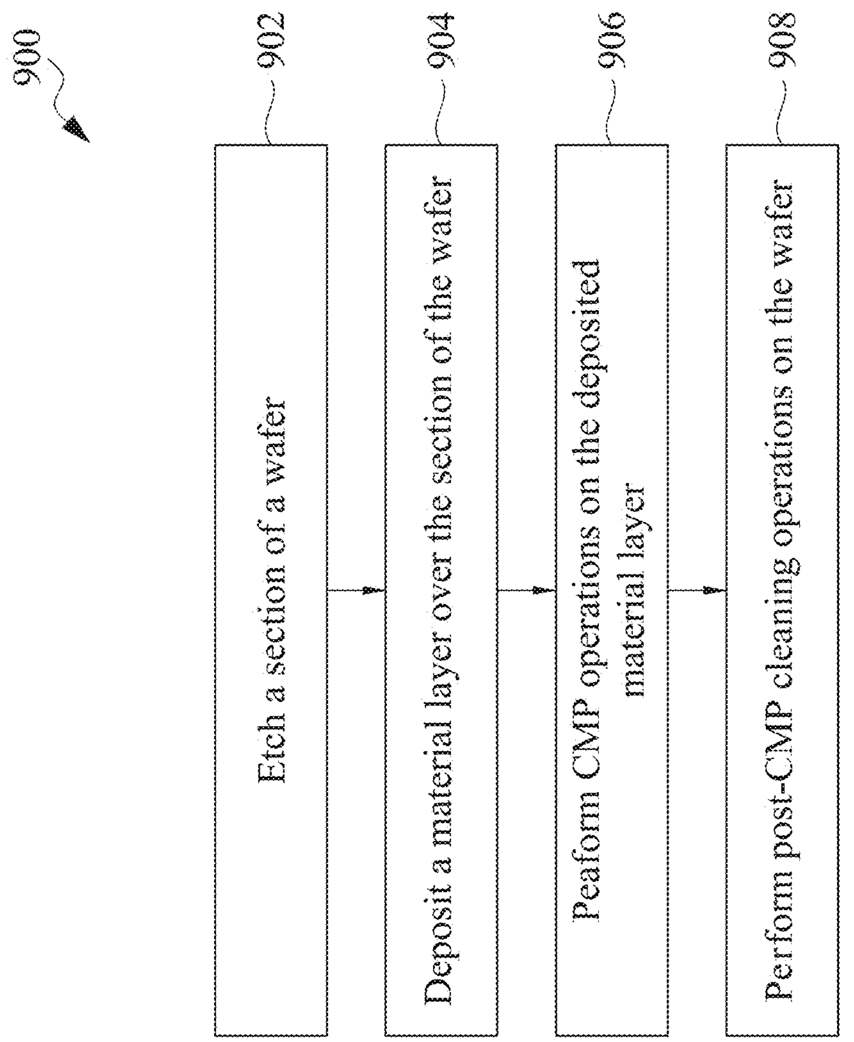
FIG. 9 is a process flow chart depicting an example fabrication process on a wafer that includes CMP operations, in accordance with various embodiments.

FIG. 9 is a process flow chart depicting an example fabrication process 900 on a wafer that includes CMP operations. The process 900 is merely an example, and is not intended to limit the present disclosure beyond what is explicitly recited in the claims. Additional steps may be provided before, during, and after example process 900, and some of the steps described can be moved, replaced, or eliminated for additional embodiments of example process 900.

At block 902, the example process 900 includes etching a section of a wafer and, at block 904, the example process 900 includes depositing a material layer over the section of the wafer. The depositing a material layer may include depositing an oxide layer such as an ILD layer or a metal layer such as a copper layer for a metal interconnect.

At block 906, the example process 900 includes performing CMP operations on the deposited material layer. The CMP operations may include planarizing to a first level using a first polishing pad and planarizing to a next level using another polishing pad.

At block 908, the example process 900 includes performing post-CMP cleaning operations on the wafer. Post-CMP cleaning operations include supporting the wafer, for example, using chuck rollers during cleaning operations. Post-CMP cleaning operations may also include applying a cleaning solution to the wafer and brushing the wafer with a brush roller or pencil roller.

Figures 10A, 10B, 10C:
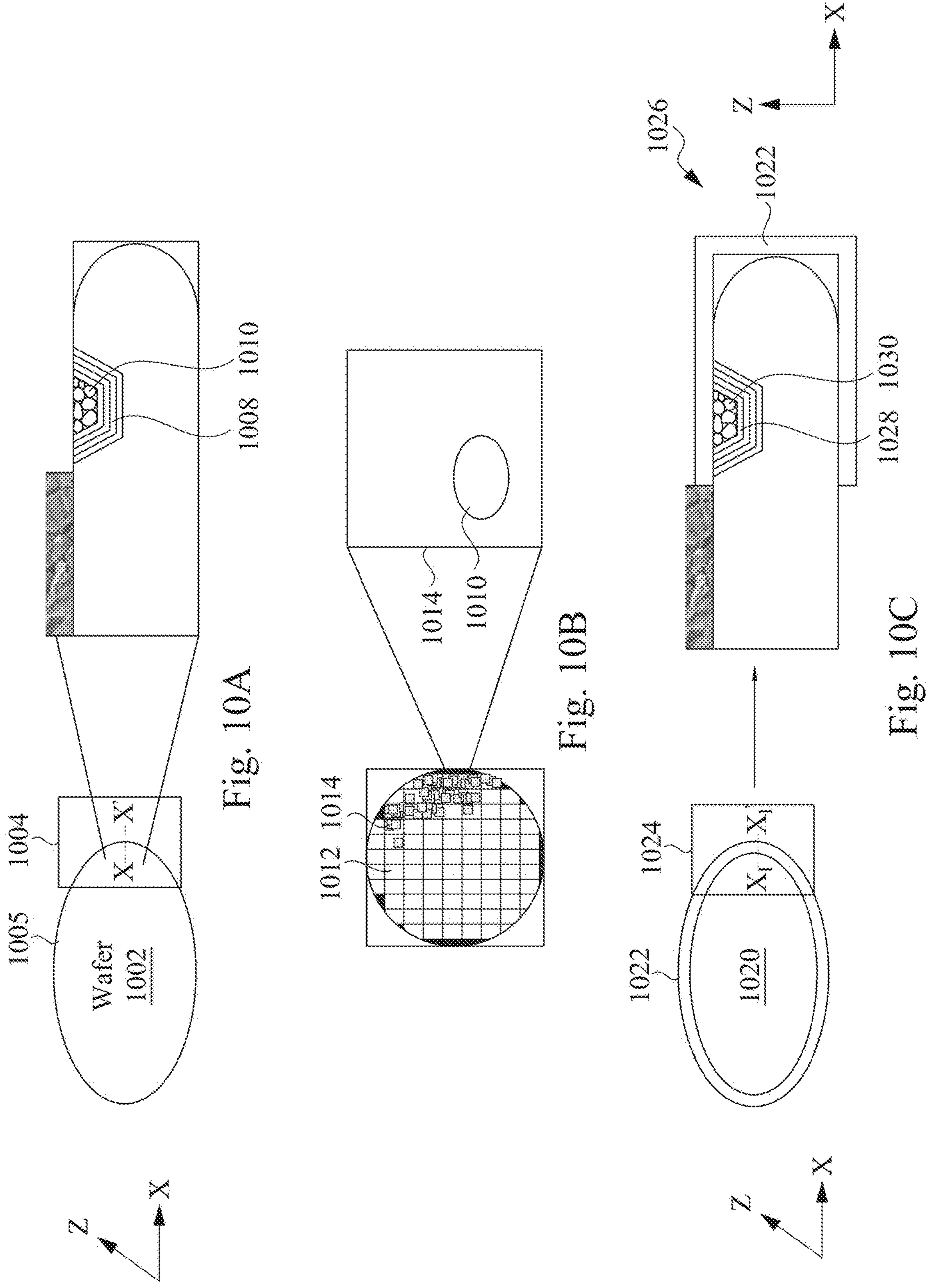
FIG. 10A schematically illustrates end regions near a periphery of a wafer that include imperfections or holes that may catch and hold residue from earlier fabrication operations, in accordance with various embodiments.
FIG. 10B schematically illustrates potentially contaminated regions of a wafer from debris spread by a cleaning brush or pencil during post-CMP cleaning operations without the use of an end chuck, in accordance with various embodiments.
FIG. 10C schematically illustrates a wafer with an end chuck formed around a periphery of the wafer, in accordance with various embodiments.

FIG. 10A schematically illustrates end regions near a periphery 1005 of a wafer 1002 that include imperfections or holes that may catch and hold residue from earlier fabrication operations. The imperfections can function as a dirty source for spreading residue during post-CMP cleaning operations. During post-CMP cleaning operations without an end chuck, a cleaning brush or pencil may catch some of the residue in the imperfections and spread them as debris to other parts of the wafer. Depicted are a wafer 1002, a section 1004 of the wafer 1002, and a cross-sectional view 1006 comprising a slice of the section 1004 of the wafer taken along a line segment X-X', wherein the slice is in a direction perpendicular to a plane containing a top surface of the wafer. The cross-sectional view 1006 illustrates an imperfection 1008 that has captured residue 1010 and that can function as a dirty source.

FIG. 10B schematically illustrates potentially contaminated regions of a wafer from debris spread by a cleaning brush or pencil during post-CMP cleaning operations without the use of an end chuck. Illustrated is a wafer 1012 with contaminated regions 1014. Also, illustrated is a piece of residue 1010 that contaminated a contaminated region 1014.

FIG. 10C schematically illustrates a wafer 1020 with an end chuck 1022 formed around a periphery of the wafer 1020. Also depicted are a section 1024 of the wafer, and a cross-sectional view 1026 comprising a slice of the section 1024 of the wafer taken along a line segment $X_1$-$X_1$', wherein the slice is in a direction perpendicular to a plane containing a top surface of the wafer. The cross-sectional view 1026 illustrates an imperfection 1028 that has captured residue 1030. In this example, the end chuck 1022 covers the imperfection 1028 and the captured residue 1030 thus preventing the imperfection 1028 from functioning as a dirty source. When a cleaning brush or pencil during post-CMP cleaning operations passes over the outer regions of the wafer 1020, the imperfection 1028 and the captured residue 1030 are shielded from the cleaning brush or pencil by the end chuck 1022, thus preventing the cleaning brush or pencil from capturing residue 1030, spreading the residue 1030 to other regions of the wafer, and contaminating other regions of the wafer.

Figure 11:
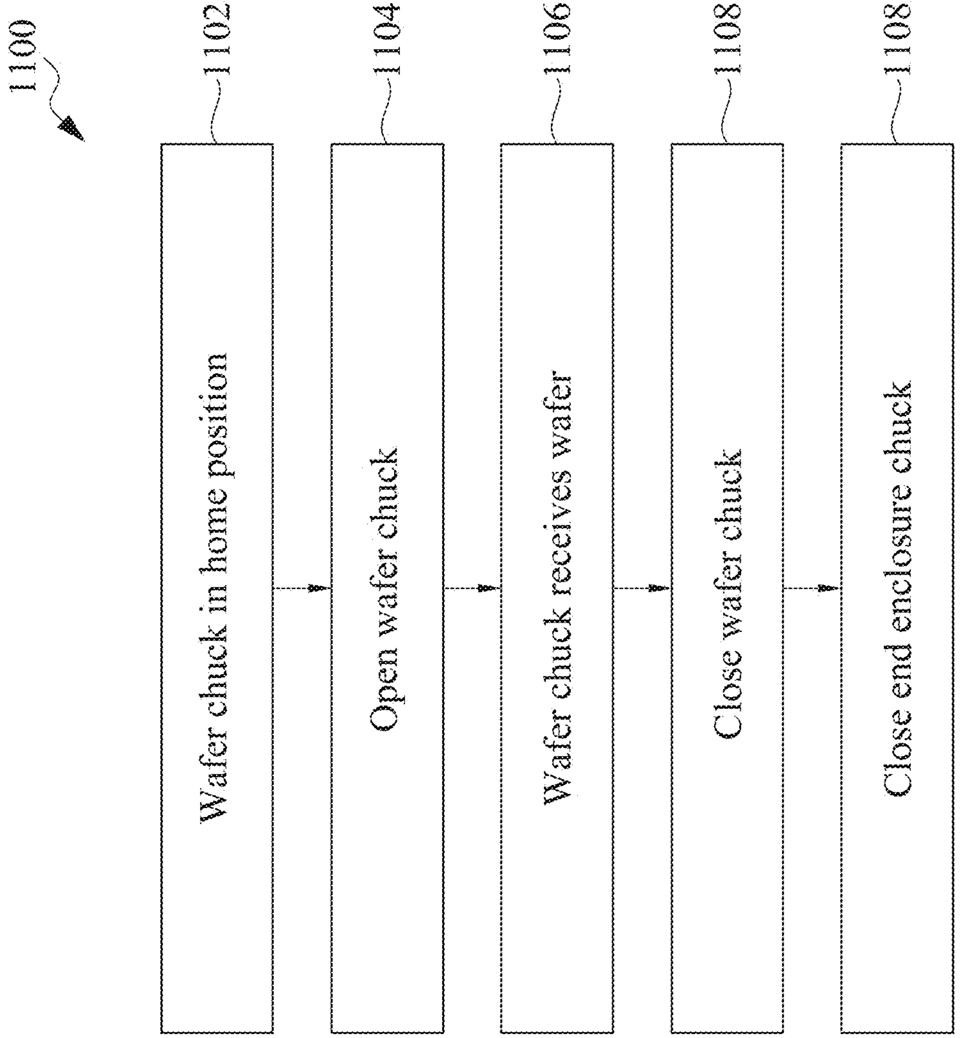
FIG. 11 is a process flow chart depicting an example semiconductor process that includes use of a wafer chuck and an end chuck, in accordance with various embodiments.

FIG. 11 is a process flow chart depicting an example semiconductor process 1100 that includes use of a wafer chuck and an end chuck. Example process 1100 is explained in connection with FIGS. 12A-12E, which schematically depict an example use of a wafer chuck and an end chuck. The process 1100 is merely an example, and is not intended to limit the present disclosure beyond what is explicitly recited in the claims. Additional steps may be provided before, during, and after example process 1100, and some of the steps described can be moved, replaced, or eliminated for additional embodiments of example process 1100.

Figures 12A, 12B, 12C, 12D, 12E:
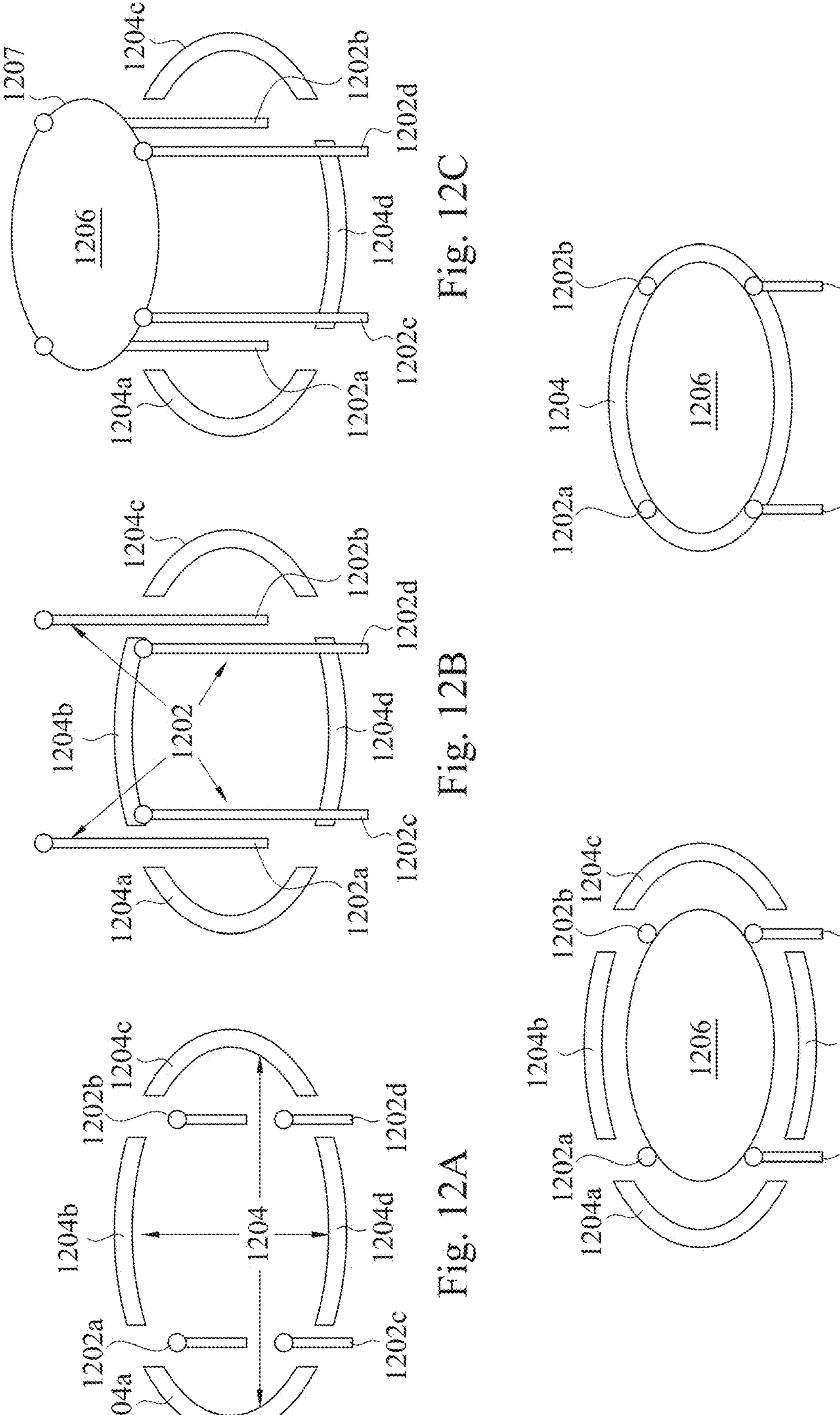
FIG. 12A illustrates a wafer chuck and an end chuck, in accordance with various embodiments.
FIG. 12B illustrates the wafer chuck in an open position with its plurality of chuck sections extended above the end chuck to allow a wafer to be captured, in accordance with various embodiments.
FIG. 12C illustrates a wafer chuck that has received a wafer, in accordance with various embodiments.
FIG. 12D illustrates the wafer chuck in the closed position with the individual chuck sections returned to a home position, in accordance with various embodiments.
FIG. 12E illustrates the end chuck closed to enclose and cover end regions near a periphery of the wafer that may contain imperfections that capture residue, in accordance with various embodiments.

At block 1102, a wafer chuck is in a home position. FIG. 12A, in an embodiment of block 1102, illustrates a wafer chuck 1202 and an end chuck 1204. The wafer chuck 1202 includes a plurality of chuck sections (1202*a*, 1202*b*, 1202*c*, 1202*d*) (4 in this example) for holding a wafer. In other examples, fewer (e.g., 2) or more individual chuck sections may make up the wafer chuck 1202. The end chuck 1204 is divided into a plurality of end chuck sections (1204*a*, 1204*b*, 1204*c*, 1204*d*) (4 in this example) that are non-contiguous (e.g., in an open state of the end chuck 1204) for receiving a wafer within the chuck 1204 and that can be brought together as a substantially contiguous unit (e.g., in a closed state of the end chuck 1204) to enclose and cover end regions near a periphery of a wafer that may contain imperfections that capture residue. In other examples, fewer or more end chuck sections may make up the end chuck 1204. In various embodiments, the plurality of end chuck sections (1204*a*, 1204*b*, 1204*c*, 1204*d*) are moveable to position the end chuck 1204 between an open state and a closed state around a wafer.

At block 1104, the wafer chuck is opened to allow a wafer to be received. FIG. 12B, in an embodiment of block 1104, illustrates the wafer chuck 1202 in an open position with its plurality of chuck sections (1202*a*, 1202*b*, 1202*c*, 1202*d*) extended above the end chuck 1204 to allow a wafer to be captured. The end chuck 1204 is separated into a plurality of non-contiguous end chuck sections (1204*a*, 1204*b*, 1204*c*, 1204*d*).

At block 1106, the wafer chuck receives a wafer. FIG. 12C, in an embodiment of block 1106, illustrates a wafer chuck 1202 that has received a wafer 1206. The wafer is held by the wafer chuck At block 1108, the wafer chuck is closed. FIG. 12D, in an embodiment of block 1108, illustrates the wafer chuck 1202 in the closed position with the individual chuck sections (1202*a*, 1202*b*, 1202*c*, 1202*d*) returned to a home position.

At block 1110, the end chuck is closed to enclose the wafer. FIG. 12E, in an embodiment of block 1110, illustrates the end chuck 1204 closed to enclose and cover end regions near a periphery 1207 of the wafer 1206 that may contain imperfections that capture residue. In various embodiments, the end chuck closes to form a substantially contiguous structure.

Figures 13A, 13B:
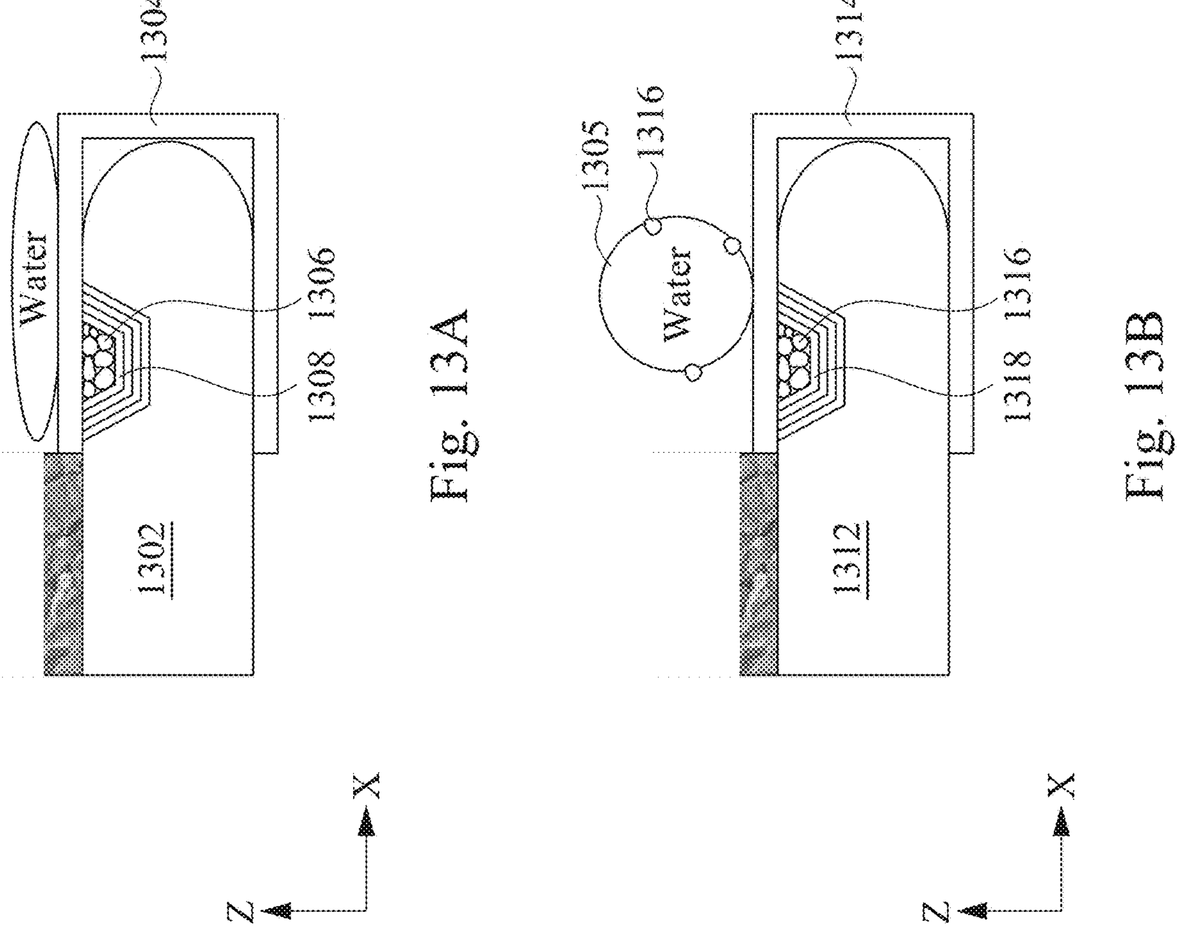
FIG. 13A is a cross-sectional view of a wafer with an end chuck formed from hydrophilic material, in accordance with various embodiments.
FIG. 13B is a cross-sectional view of a wafer with an end chuck formed from hydrophobic material, in accordance with various embodiments.

FIG. 13A is a cross-sectional view of a wafer 1302 with an end chuck 1304 formed from hydrophilic material. The end chuck 1304 formed from hydrophilic material provides inhibitor protection at the wafer edge to prevent debris 1306 from the escaping the imperfections 1308 at the wafer edge. In various embodiments, the hydrophilic material comprises a photocatalyst. In various embodiments, the wafer chuck is formed from identical material as the end chuck.

FIG. 13B is a cross-sectional view of a wafer 1312 with an end chuck 1314 formed from hydrophobic material. The end chuck 1314 formed from hydrophobic material repels water 1305 at the wafer edge to cause any debris 1316 that escaped from the imperfections 1318 in the wafer edge to be washed away. In various embodiments, the hydrophobic material comprises one or more of acrylic resin, epoxy resin, polyethylene, polystyrene, polyvinyl chloride, polytetrafluoroethylene, polydimethylsiloxane, polyester, or polyurethane. In various embodiments, the wafer chuck is formed from the same material as the end chuck.

Figures 14A, 14B, 14C, 14D:
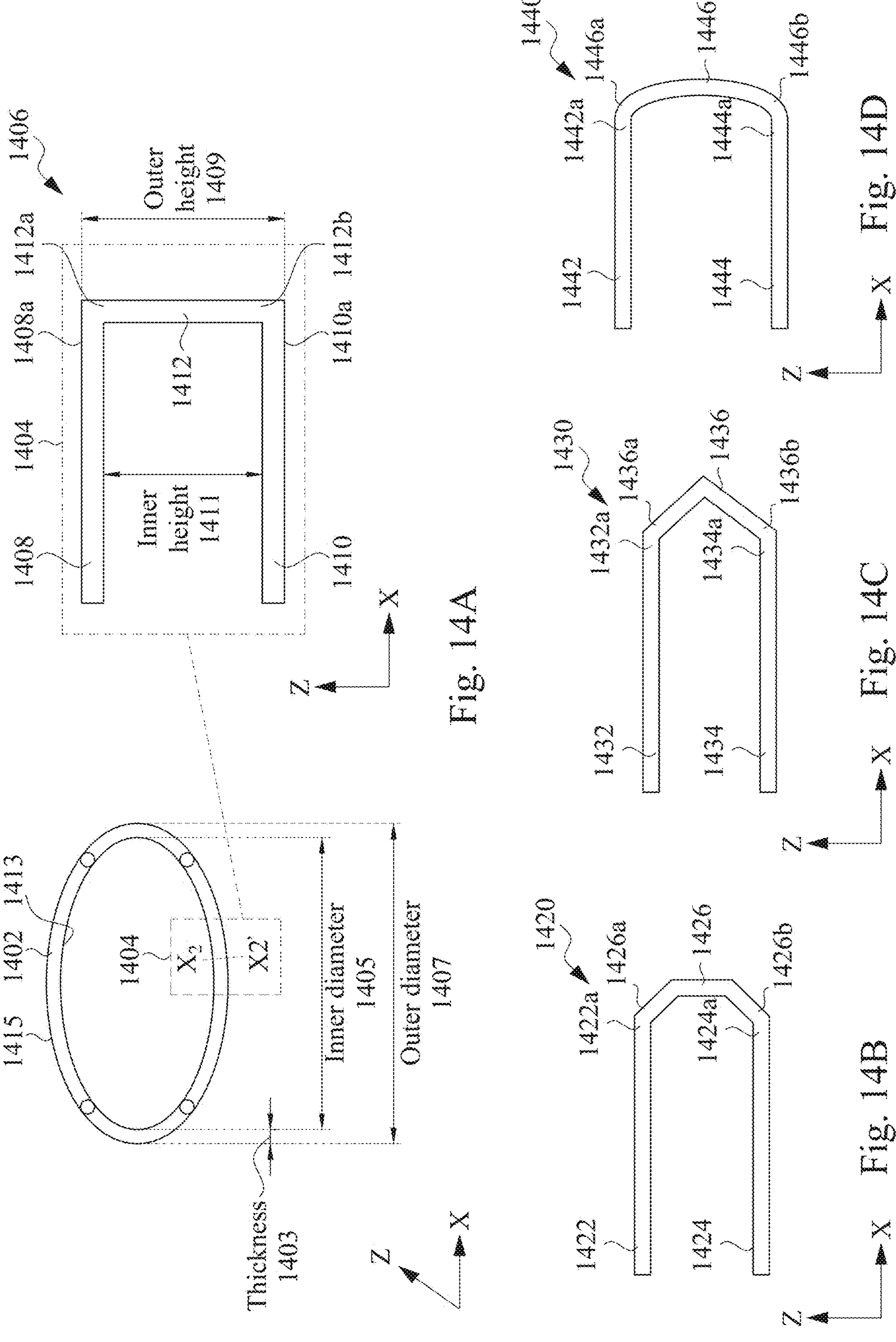
FIG. 14A is a top view of an example end chuck, in accordance with various embodiments.
FIG. 14B is a cross-sectional view of a section of an end chuck, in accordance with various embodiments.
FIG. 14C is a cross-sectional view of a section of an end chuck, in accordance with various embodiments.
FIG. 14D is a cross-sectional view of a section of an end chuck, in accordance with various embodiments.

FIG. 14A is a top view of an example end chuck 1402. Depicted are the end chuck 1402, a section 1404 of the end chuck 1402, and a cross-sectional view 1406 comprising a slice of the section 1404 of the end chuck 1402 taken along a line segment $X_2$-$X_2$', wherein the slice is in a direction perpendicular to a plane containing a top surface of the end chuck 1402. The cross-sectional view 1406 illustrates an example cross-sectional shape of the end chuck. The example end chuck includes a top piece (or cover section) 1408, a bottom piece 1410, and a middle piece 1412, wherein the top piece 1408 connects at an end region 1408*a* to a first end region 1412*a* of the middle piece 1412 and the middle piece 1412 connects at a second end region 1412*b* to an end region 1410*a* of the bottom piece 1410. In this example, the middle piece 1412 has a linear shape.

The example end chuck 1402 has a thickness 1403 that corresponds to the length of the end region of a wafer that is covered by the end chuck 1402. When the end chuck 1402 has an annular shape in a top view, such as in the example of FIG. 14A, the end chuck 1402 has an inner diameter 1405 and an outer diameter 1407. The thickness 1403 of an end chuck with a top view having an annular shape corresponds to twice (2×) the difference between the length of the outer diameter 1407 and the length of the inner diameter 1405. In various embodiments the thickness is between approximately 1 mm to approximately 30 mm. In various embodiments, the inner diameter is between approximately 200 mm to approximately 450 mm. In various embodiments, the outer diameter is between approximately 201 mm to approximately 480 mm.

The example end chuck has an outer height 1409 that is a length measured from the top of the top piece 1408 to the bottom of the bottom piece 1410 and an inner height 1411 that is a length measured from the bottom of the top piece 1408 to the top of the bottom piece 1410. In various embodiments, the outer height of the end chuck is about 0.5 mm to approximately 2 mm.

FIG. 14B is a cross-sectional view 1420 comprising a slice of the section 1404 of the end chuck 1402 taken along the line segment $X_2$-$X_2$', wherein the slice is in a direction perpendicular to a plane containing a top surface of the end chuck 1402. The cross-sectional view 1420 illustrates another example cross-sectional shape of the end chuck 1402. The end chuck includes a top piece 1422, a bottom piece 1424, and a middle piece 1426, wherein the top piece 1422 connects at an end region 1422*a* to a first end region 1426*a* of the middle piece 1426 and the middle piece 1426 connects at a second end region 1426*b* to an end region 1424*a* of the bottom piece 1424. In this example, the middle piece 1426 comprises a plurality of (three in this example) connected linear segments. The top piece, when viewed from a top view as in FIG. 14A, has a shape (annular in this example) with an inner periphery 1413 and an outer periphery 1415.

FIG. 14C is a cross-sectional view 1430 comprising a slice of the section 1404 of the end chuck 1402 taken along the line segment $X_2$-$X_2$', wherein the slice is in a direction perpendicular to a plane containing a top surface of the end chuck 1402. The cross-sectional view 1430 illustrates another example cross-sectional shape of the end chuck 1402. The end chuck includes a top piece 1432, a bottom piece 1434, and a middle piece 1436, wherein the top piece 1432 connects at an end region 1432*a* to a first end region 1436*a* of the middle piece 1436 and the middle piece 1436 connects at a second end region 1436*b* to an end region 1434*a* of the bottom piece 1434. In this example, the middle piece 1436 comprises a plurality of (two in this example) connected linear segments.

FIG. 14D is a cross-sectional view 1420 comprising a slice of the section 1404 of the end chuck 1402 taken along the line segment $X_2$-$X_2$', wherein the slice is in a direction perpendicular to a plane containing a top surface of the end chuck 1402. The cross-sectional view 1440 illustrates another example cross-sectional shape of the end chuck 1402. The end chuck includes a top piece 1442, a bottom piece 1444, and a middle piece 1446, wherein the top piece 1442 connects at an end region 1442*a* to a first end region 1446*a* of the middle piece 1446 and the middle piece 1446 connects at a second end region 1446*b* to an end region 1444*a* of the bottom piece 1444. In this example, the middle piece 1446 comprises a curved segment, such as a semi-circular or semi-oval shape.

Figure 15A:
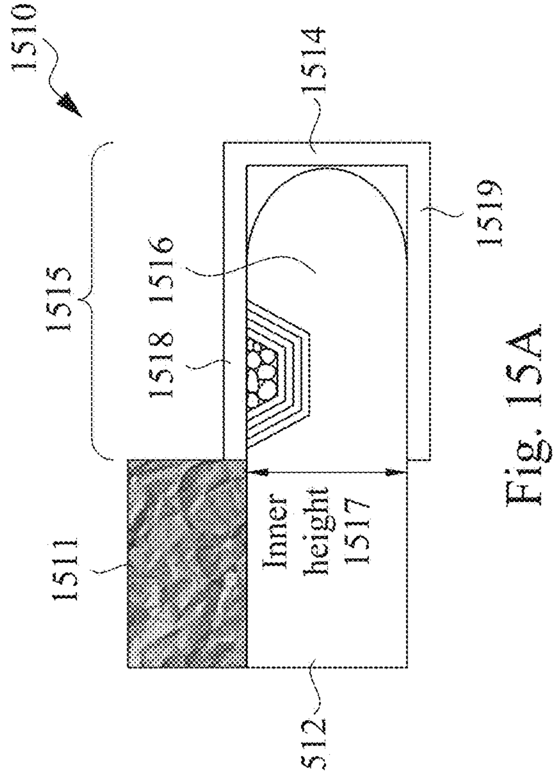
FIG. 15A is a cross-sectional view of a wafer with an end chuck fitted over an end section of the wafer, in accordance with various embodiments.

FIG. 15A is a cross-sectional view 1510 of a wafer 1512 with an end chuck 1514 fitted over an end section 1516 of the wafer 1512, wherein the cross-sectional view 1510 is along a plane that is perpendicular to a plane containing a top surface of the wafer 1512. The cross-sectional view 1510 illustrates that the example end chuck 1514 has an inner height 1517 that is substantially equal to the thickness of the wafer 1512. In other embodiments, the inner height may be greater than or the thickness of the wafer. The cross-sectional view 1510 also illustrates a top surface of a top piece 1518 of the end chuck 1514 that is substantially parallel to a top surface of the bottom piece 1519 of the end chuck 1514. The cross-sectional view 1510 also illustrates that the top surface of the top piece 1518 of the end chuck 1514 may be substantially parallel to a top surface of the wafer 1512. The cross-sectional view 1510 also illustrates that the thickness 1515 of the end chuck 1514 is large enough to cover the end section 1516 of the wafer 1512 on which semiconductor fabrication has not taken place but not too large to cover fabricated regions 1511 of the wafer 1512.

Figure 15B:
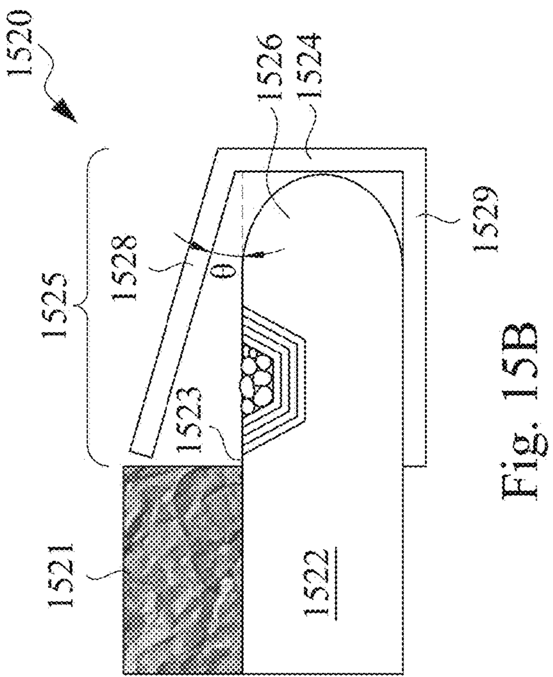
FIG. 15B is a cross-sectional view of a wafer with an end chuck fitted over an end section of the wafer, in accordance with various embodiments.

FIG. 15B is a cross-sectional view 1520 of a wafer 1522 with an end chuck 1524 fitted over an end section 1526 of the wafer 1522, wherein the cross-sectional view 1520 is along a plane that is perpendicular to a plane containing a top surface 1523 of the wafer 1522. The cross-sectional view 1520 also illustrates a top surface of a top piece 1528 of the end chuck 1524 that is in a first plane, a top surface of a bottom piece 1529 of the end chuck 1524 is in a second plane, and the first plane and the second plane have an angular difference θ. In various embodiments, the angular difference θ is between 1 to 45 degrees. The cross-sectional view 1520 also illustrates that the thickness 1525 of the end chuck 1524 is large enough to cover the end section 1526 of the wafer 1522 on which semiconductor fabrication has not taken place but not too large to cover fabricated regions 1521 of the wafer 1522.

Figure 15C:
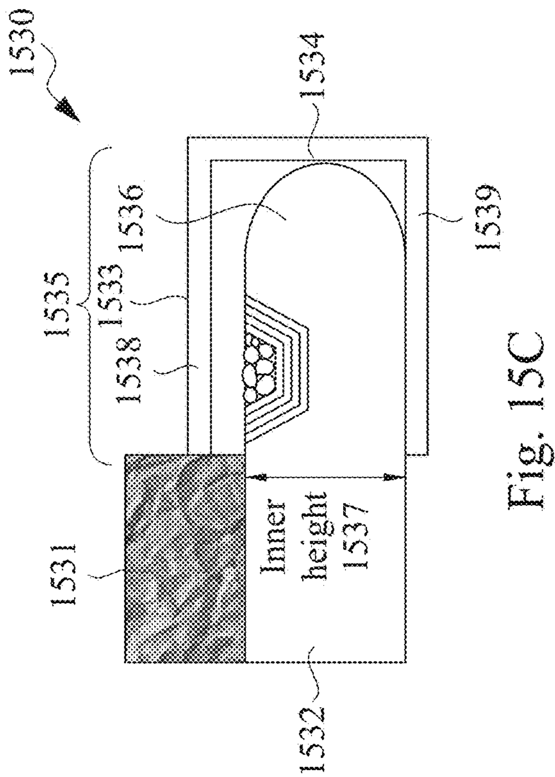
FIG. 15C is a cross-sectional view of a wafer with an end chuck over an end section of the wafer, in accordance with various embodiments.

FIG. 15C is a cross-sectional view 1530 of a wafer 1532 with an end chuck 1534 over an end section 1536 of the wafer 1532, wherein the cross-sectional view 1530 is along a plane that is perpendicular to a plane containing a top surface 1533 of the wafer 1532. The cross-sectional view 1530 illustrates that the example end chuck 1534 has an inner height 1537 that is substantially greater than the thickness of the wafer 1532. The cross-sectional view 1530 also illustrates a top surface of a top piece 1538 of the end chuck 1534 that is substantially parallel to a top surface of the bottom piece 1539 of the end chuck 1534. The cross-sectional view 1530 also illustrates that the top surface of the top piece 1538 of the end chuck 1514 may be substantially parallel to the top surface 1533 of the wafer 1532. The cross-sectional view 1530 also illustrates that the thickness 1535 of the end chuck 1534 is large enough to cover the end section 1536 of the wafer 1532 on which semiconductor fabrication has not taken place but not too large to cover fabricated regions 1531 of the wafer 1532.

Figure 15D:
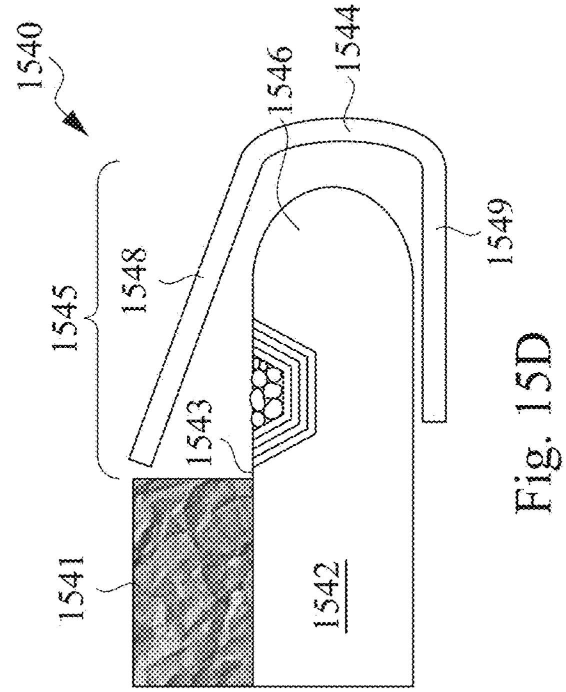
FIG. 15D is a cross-sectional view of a wafer with an end chuck fitted over an end section of the wafer, in accordance with various embodiments.

FIG. 15D is a cross-sectional view 1540 of a wafer 1542 with an end chuck 1544 fitted over an end section 1546 of the wafer 1542, wherein the cross-sectional view 1540 is along a plane that is perpendicular to a plane containing a top surface 1543 of the wafer 1542. The cross-sectional view 1540 also illustrates a top surface of a top piece 1548 of the end chuck 1544 that is in a first plane, a top surface of a bottom piece 1549 of the end chuck 1544 is in a second plane, and the first plane and the second plane have an angular difference O. In various embodiments, the angular difference θ is between 1 to 45 degrees. The cross-sectional view 1540 also illustrates that the thickness 1545 of the end chuck 1544 is large enough to cover the end section 1546 of the wafer 1542 on which semiconductor fabrication has not taken place but not too large to cover fabricated regions 1541 of the wafer 1542.

Figures 16A, 16B, 16C, 16D, 16E:
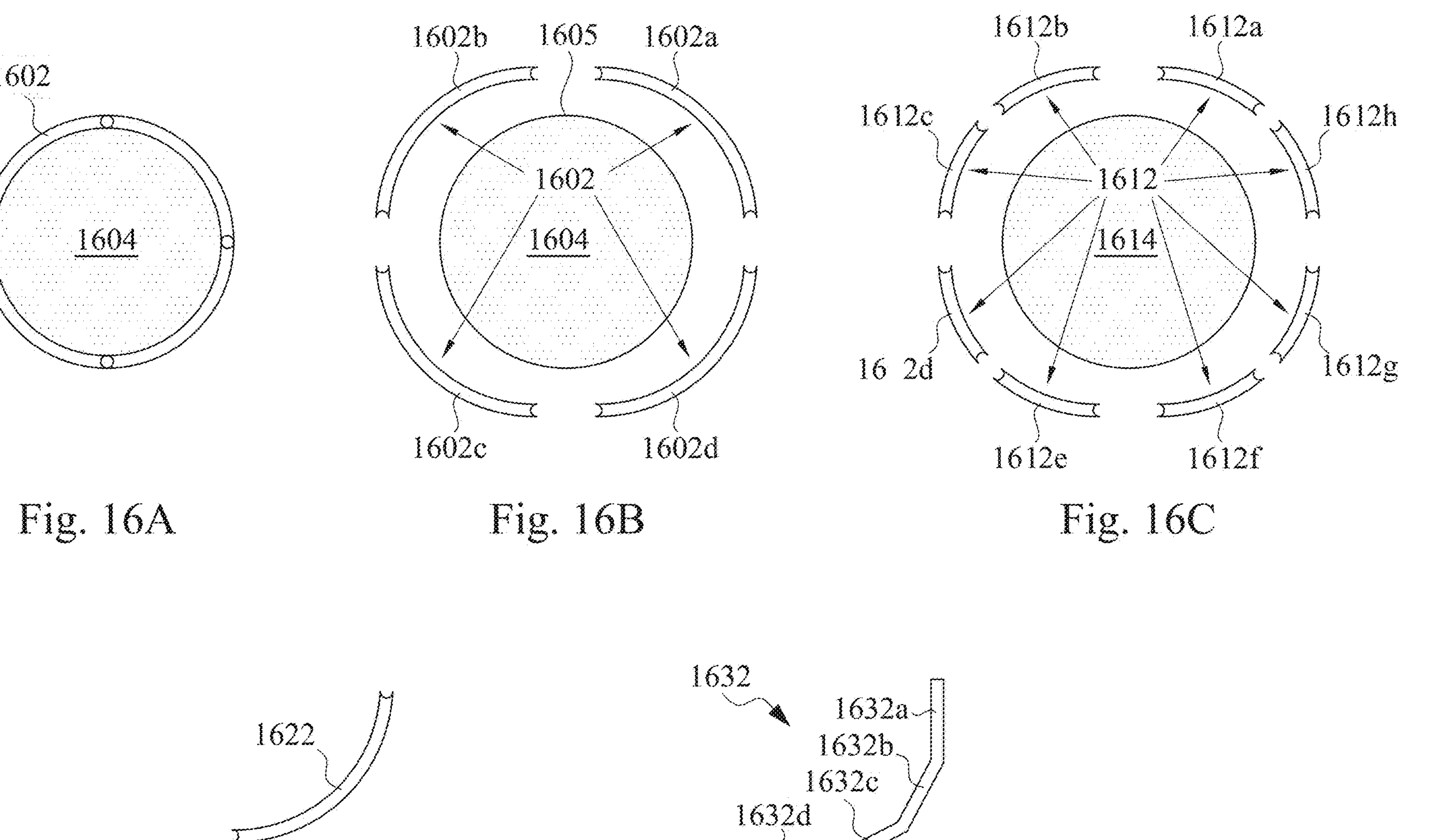
FIG. 16A is a top view illustrating an end chuck in a closed state surrounding a wafer and covering end regions near a periphery of the wafer, in accordance with various embodiments.
FIG. 16B is a top view illustrating an end chuck in an open state surrounding the periphery of a wafer, in accordance with various embodiments.
FIG. 16C is a top view illustrating another end chuck in an open state surrounding a wafer, in accordance with various embodiments.
FIG. 16D is a top view of an example end chuck section, in accordance with various embodiments.
FIG. 16E is a top view of another example end chuck section, in accordance with various embodiments.

FIG. 16A is a top view illustrating an end chuck 1602 in a closed state surrounding a wafer 1604 and covering end regions near a periphery of the wafer 1604, according to various embodiments. In these embodiments, the end chuck 1602 has an annular shape when viewed from a top view. In other embodiments, the end chuck may have a polygonal shape formed from multiple linear end chuck sections when viewed from a top view.

FIG. 16B is a top view illustrating the end chuck 1602 in an open state surrounding the periphery 1605 of the wafer 1604, according to various embodiments. In these embodiments, the end chuck 1602 has four end chuck sections (1602*a*, 1602*b*, 1602*c*, 1602*d*). In other embodiments, the end chuck may have fewer or more end chuck sections.

FIG. 16C is a top view illustrating another end chuck 1612 in an open state surrounding a wafer 1614, according to various embodiments. In these embodiments, the end chuck 1612 has eight end chuck sections (1612*a*, 1612*b*, 1612*c*, 1612*d*, 1612*e*, 1612*f*, 1612*g*, 1612*h*). In other embodiments, the end chuck may have different numbers of end chuck sections.

FIG. 16D is a top view of an example end chuck section 1622, according to various embodiments. In these embodiments, the end chuck section 1622 has a curved shape when viewed from a top view.

FIG. 16E is a top view of another example end chuck section 1632, according to various embodiments. In these embodiments, the end chuck section 1632 has a polygonal shape formed from multiple linear pieces (1632*a*, 1632*b*, 1632*c*, 1632*d*) when viewed from a top view. In this example, four (4) linear sections are illustrated. An end chuck formed from the example end chuck section 1632 may have a polygonal shape when viewed from a top view.

Figure 17:
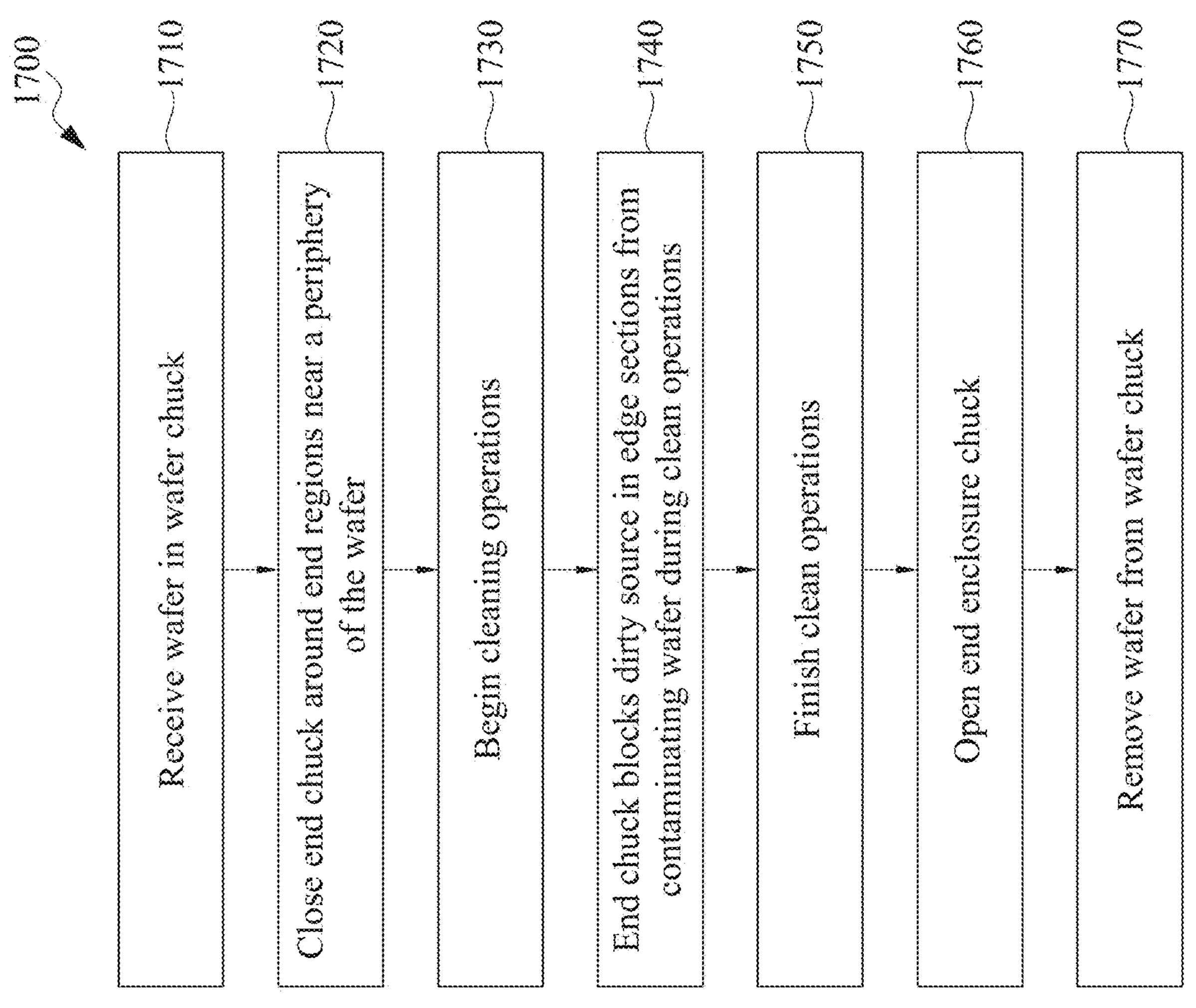
FIG. 17 is a process flow chart depicting an example semiconductor fabrication method, in accordance with various embodiments.

FIG. 17 is a process flow chart depicting an example semiconductor fabrication method. The process 1700 is merely an example, and is not intended to limit the present disclosure beyond what is explicitly recited in the claims. Additional steps may be provided before, during, and after example process 1700, and some of the steps described can be moved, replaced, or eliminated for additional embodiments of example process 1700.

At operation 1710, the process 1700 includes receiving a wafer in a wafer chuck. In various embodiments, the wafer has a surface that has been polished using chemical mechanical planarization (CMP) operations. In various embodiments, receiving the wafer comprises receiving the wafer in a brush chamber. In various embodiments, receiving the wafer comprises receiving the wafer in a pencil chamber. In various embodiments, receiving the wafer comprises receiving the wafer in a double pencil chamber. In various embodiments, receiving the wafer comprises receiving the wafer in a pre-clean chamber.

At operation 1720, the process 1700 includes closing an end chuck around end regions near a periphery of the wafer. This results in covering the end regions near the periphery of the wafer with the end chuck (e.g., the cover of the end chuck). In various embodiments, the end regions include imperfections containing residue from an earlier fabrication operation. In various embodiments, the end chuck has a plurality of sections (e.g., 4) and closing the end chuck comprises moving the plurality of end chuck sections together to form a contiguous shape having an outer periphery with a diameter that is greater in length than a diameter of the inner periphery.

In various embodiments, the end chuck includes a top piece, a bottom piece, and a middle piece, wherein the top piece connects at an end section to a first end section of the middle piece and the middle piece connects at a second end section to an end section of the bottom piece. In various embodiments, when connected in a contiguous shape, the top piece has a first shape (e.g., annular) when viewed from a top view. In various embodiments, the first shape has an inner periphery and an outer periphery; a straight line segment between a first point on the inner periphery, a center of the contiguous shape, and a second point on the inner periphery is shorter than a longest length across the wafer; and a straight line segment between a point on the outer periphery, a center of the contiguous shape, and a second point on the outer periphery is longer than a longest length across the wafer. In various embodiments, when connected in the contiguous shape, the bottom piece includes the same shape as the top piece.

In various embodiments, a top surface of the top piece (e.g., the cover) is substantially parallel to a top surface of the bottom piece. In various embodiments, a top surface of the top piece is in a first plane, a top surface of the bottom piece is in a second plane, and the first plane and the second plane have an angular difference. In various embodiments, the angular difference is between 1 to 45 degrees.

In various embodiments, when connected in a contiguous shape, the top piece has a first annular shape, as viewed from a top view, with an inner diameter and an outer diameter; the inner diameter is shorter than a length across the wafer; and the outer diameter is longer than the length across the wafer. In various embodiments, when connected in the contiguous shape.

In various embodiments, the contiguous shape has an outer diameter that is a length of a first straight line segment from a first point on the outer periphery to a center point of the contiguous shape to a second point on the outer periphery, and an inner diameter that is a length of a second straight line segment from a first point on the inner periphery to a center point of the contiguous shape to a second point on the inner periphery.

At operation 1730, the process 1700 includes begin cleaning operations. In various embodiments, the cleaning operations are performed using a wafer cleaning tool (e.g., brush or pencil) and cleaning solution. In various embodiments, the wafer cleaning tool comprises a pencil when the wafer is received in a pencil chamber or a double pencil chamber. In various embodiments, the wafer cleaning tool comprises a brush when the wafer is received in a brush chamber.

At operation 1740, the end chuck blocks the dirty source in the edge sections from contaminating the wafer during cleaning operations. In various embodiments, this includes preventing the dirty source from contaminating a cleaning solution used during cleaning operations. In various embodiments, this includes preventing the dirty source from contaminating the wafer cleaning tool during cleaning operations. In various embodiments, this includes preventing the dirty source from contaminating the clean chamber during cleaning operations. At operation 1750, the cleaning operations are finished.

At operation 1760, the process 1700 includes opening the end chuck. This results in uncovering the end regions. At operation 1770, the process 1700 includes removing the wafer from the wafer chuck. Further semiconductor fabrication operations may then be performed.

In various embodiments, use of the end chuck during post CMP cleaning may prevent debris from the end regions of the wafer from polluting the brush and/or pencil chamber. In various embodiments, use of the end chuck during post CMP cleaning may extend the useful life of the brush and/or pencil chamber due to a reduction in debris from end regions of the wafer contaminating the chamber. In various embodiments, use of the end chuck during post CMP cleaning may reduce defects in the wafer.

Although the foregoing describes the use of the end chuck while cleaning a wafer post-CMP, the end chuck may be used while cleaning a wafer prior to CMP operations.

In some aspects, the techniques described herein relate to a chucking apparatus, including: a plurality of end chuck sections that are moveable to position the chucking apparatus between an open state and a closed state around a substrate; wherein in the open state, the plurality of end chuck sections are separated from each other; and wherein in the closed state, the plurality of end chuck sections cooperate to form a substantially contiguous shape around the substrate that is configured to cover end regions near a periphery of the substrate and is configured to block a wafer cleaning tool from contact with the end regions near the periphery of the substrate.

In some aspects, the techniques described herein relate to a chucking apparatus, wherein the plurality of end chuck sections include a top piece and a bottom piece and wherein a top surface of the top piece is substantially parallel to a top surface of the bottom piece.

In some aspects, the techniques described herein relate to a chucking apparatus, wherein the plurality of end chuck sections include a top piece and a bottom piece and wherein a top surface of the top piece is in a first plane, a top surface of the bottom piece is in a second plane, and the first plane and the second plane have an angular difference of between 1 to 45 degrees.

In some aspects, the techniques described herein relate to a chucking apparatus, including an inner height of between 0.5 mm to approximately 2 mm.

In some aspects, the techniques described herein relate to a chucking apparatus, including a thickness of between 1 mm to approximately 30 mm.

In some aspects, the techniques described herein relate to a chucking apparatus, wherein the plurality of end chuck sections include a top piece and the top piece has an inner diameter of between 200 mm to approximately 450 mm.

In some aspects, the techniques described herein relate to a chucking apparatus, wherein the plurality of end chuck sections include a top piece and the top piece has an outer diameter of between 201 mm to approximately 480 mm.

In some aspects, the techniques described herein relate to a semiconductor fabrication method, including: receiving a substrate; closing an end chuck around end regions near a periphery of the substrate thereby covering the end regions with the end chuck; processing the substrate using a wafer cleaning tool; opening the end chuck after processing the substrate thereby uncovering the end regions; and providing the substrate for further semiconductor fabrication operations.

In some aspects, the techniques described herein relate to a method, wherein receiving the substrate includes receiving the substrate via a wafer chuck and wherein the wafer chuck and the end chuck are formed from identical material.

In some aspects, the techniques described herein relate to a method, wherein receiving the substrate includes receiving the substrate in a pencil chamber or a double pencil chamber and the wafer cleaning tool includes a pencil.

In some aspects, the techniques described herein relate to a method, wherein receiving the substrate includes receiving the substrate in a brush chamber and the wafer cleaning tool includes a brush.

In some aspects, the techniques described herein relate to a method, wherein a surface of the substrate has been polished using chemical mechanical planarization (CMP) operations prior to receiving the substrate.

In some aspects, the techniques described herein relate to a method, wherein receiving the substrate includes receiving the substrate in a pre-clean chamber.

In some aspects, the techniques described herein relate to a substrate cleaning system, including: a substrate chuck configured to hold a substrate during substrate cleaning operations; a substrate cleaning tool; and an end chuck including: a cover section; an open state wherein the cover section is separated into a plurality of non-contiguous sections; and a closed state wherein the cover section forms a substantially contiguous shape above the substrate while the substrate is held by the substrate chuck; wherein in the closed state, the cover section covers end regions near a periphery of the substrate.

In some aspects, the techniques described herein relate to a substrate cleaning system, wherein a top surface of the cover section is substantially parallel to a top surface of the substrate.

In some aspects, the techniques described herein relate to a substrate cleaning system, wherein a top surface of the cover section is in a first plane and a top surface of the substrate is in a second plane, and the first plane and the second plane have an angular difference of between 1 to 45 degrees.

In some aspects, the techniques described herein relate to a substrate cleaning system, wherein the end chuck includes hydrophobic material.

In some aspects, the techniques described herein relate to a substrate cleaning system, wherein the hydrophobic material includes one or more of acrylic resin, epoxy resin, polyethylene, polystyrene, polyvinyl chloride, polytetrafluoroethylene, polydimethylsiloxane, polyester, or polyurethane.

In some aspects, the techniques described herein relate to a substrate cleaning system, wherein the end chuck includes hydrophilic material.

In some aspects, the techniques described herein relate to a substrate cleaning system, wherein the hydrophilic material includes a photocatalyst.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A chucking apparatus, comprising:
a plurality of substrate chuck sections configured to hold a substrate during substrate cleaning operations; and
a plurality of end chuck sections that are;
moveable to contact each other to form a contiguous cover over the substrate around a periphery of the substrate; in a closed state of the chucking apparatus,
configured to cover a top surface of end regions of the substrate around the periphery,
configured for use with a wafer cleaning brush during wafer cleaning operations to block the wafer cleaning brush from contact with the end regions; and
separated from each other when in an open state of the chucking apparatus.

2. The chucking apparatus of claim 1, wherein the plurality of end chuck sections comprise a top piece configured for positioning over the substrate and a bottom piece configured for positioning under the substrate and wherein a top surface of the top piece is substantially parallel to a top surface of the bottom piece.

3. The chucking apparatus of claim 1, wherein the plurality of end chuck sections comprise a top piece configured for positioning over the substrate and a bottom piece configured for positioning under the substrate and wherein a top surface of the top piece is in a first plane, a top surface of the bottom piece is in a second plane, and the first plane and the second plane have an angular difference of between 1 to 45 degrees.

4. The chucking apparatus of claim 1, wherein the plurality of end chuck sections from a cross-sectional view has an inner height measured from a top piece configured for positioning over the substrate to a bottom piece configured for positioning under the substrate of between 0.5 mm to approximately 2 mm.

5. The chucking apparatus of claim 1, wherein a top piece configured for positioning over the substrate has a thickness measured from one end of the top piece to a second end of the top piece from a cross-sectional view of between 1 mm to approximately 30 mm.

6. The chucking apparatus of claim 1, wherein the plurality of end chuck sections comprise a top piece configured for positioning over the substrate and the top piece has an inner diameter from a top view of between 200 mm to approximately 450 mm.

7. The chucking apparatus of claim 1, wherein the plurality of end chuck sections comprise a top piece configured for positioning over the substrate and the top piece has an outer diameter from a top view of between 201 mm to approximately 480 mm.

8. A substrate cleaning system, comprising:
a substrate chuck configured to hold a substrate during substrate cleaning operations;
a substrate brush; and
an end chuck comprising:
a cover section comprising a top piece positioned over a periphery of a substrate and a bottom piece positioned under the periphery of the substrate;
wherein in a closed state the top piece is configured to: form a contiguous cover positioned over and around a periphery of the substrate, cover end regions of the substrate, and block the substrate brush from contact with the end regions; and
wherein the bottom piece is configured for positioning under the substrate;
wherein the cover section forms a contiguous shape from a top view in a closed state and separates into a plurality of non-contacting parts in an open state.

9. The substrate cleaning system of claim 8, wherein a top surface of the cover section is substantially parallel to a top surface of the substrate.

10. The substrate cleaning system of claim 8, wherein a top surface of the cover section is in a first plane and a top surface of the substrate is in a second plane, and the first plane and the second plane have an angular difference of between 1 to 45 degrees.

11. The substrate cleaning system of claim 8, wherein the end chuck comprises hydrophobic material.

12. The substrate cleaning system of claim 11, wherein the hydrophobic material comprises one or more of acrylic resin, epoxy resin, polyethylene, polystyrene, polyvinyl chloride, polytetrafluoroethylene, polydimethylsiloxane, polyester, or polyurethane.

13. The substrate cleaning system of claim 8, wherein the end chuck comprises hydrophilic material.

14. The substrate cleaning system of claim 13, wherein the hydrophilic material comprises a photocatalyst.

15. A chucking apparatus, comprising:

a plurality of end chuck sections each comprising:

a top piece positioned over a section of a periphery of a substrate and configured to cover end regions of the substrate around the periphery, a bottom piece positioned under the section of the periphery of the substrate, and a middle piece positioned outside the section of the periphery of the substrate, and wherein the top piece connects at an end surface to a first end surface of the middle piece, and the middle piece connects at a second end surface to an end surface of the bottom piece, wherein the plurality of end chuck sections are moveable to cause each end chuck section of the plurality of end chuck sections to contact another end chuck section of the plurality of end chuck sections to form a substantially contiguous shape from a top view in a closed state and to separate each end chuck section of the plurality of end chuck sections from contacting another end chuck section of the plurality of end chuck sections in an open state.

16. The chucking apparatus of claim 15, wherein:

in the closed state, the top piece in a top view has an annular shape with an inner diameter and an outer diameter;

the inner diameter is shorter than a length across the substrate; and the outer diameter is longer than the length across the substrate.

17. The chucking apparatus of claim 15, wherein the middle piece in a cross-sectional view along a plane that is perpendicular to a plane encompassing a top surface of the substrate has a linear shape.

18. The chucking apparatus of claim 15, wherein the middle piece in a cross-sectional view along a plane that is perpendicular to a plane encompassing a top surface of the substrate has a curved shape.

19. The chucking apparatus of claim 15, wherein in a cross-sectional view along a plane that is perpendicular to a plane encompassing a top surface of the substrate, the middle piece comprises a plurality of linear segments that meet at an angle of less than 180 degrees.

20. The chucking apparatus of claim 15, wherein in the closed state around the substrate, a top surface of the top piece is in a first plane, a top surface of the substrate is in a second plane, and the first plane and the second plane have an angular difference between about 1 degree to about 45 degrees.

* * * * *